United States Patent
Kim et al.

(10) Patent No.: US 11,996,026 B1
(45) Date of Patent: May 28, 2024

(54) SCAN DRIVER AND DISPLAY DEVICE

(71) Applicant: Samsung Display Co., LTD., Yongin-si (KR)

(72) Inventors: Kyungho Kim, Yongin-si (KR); Gichang Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/215,736

(22) Filed: Jun. 28, 2023

(30) Foreign Application Priority Data

Nov. 9, 2022 (KR) .................. 10-2022-0148690

(51) Int. Cl.
  *G09G 3/20* (2006.01)
  *G09G 3/3266* (2016.01)
  *G09G 3/36* (2006.01)

(52) U.S. Cl.
  CPC ............. *G09G 3/20* (2013.01); *G09G 3/3266* (2013.01); *G09G 3/3677* (2013.01); *G09G 2300/0819* (2013.01); *G09G 2300/0842* (2013.01); *G09G 2310/0286* (2013.01); *G09G 2310/04* (2013.01); *G09G 2330/021* (2013.01); *G09G 2340/0435* (2013.01)

(58) Field of Classification Search
  CPC ............... G09G 3/3266; G09G 3/3677; G09G 2310/0286
  See application file for complete search history.

(56) References Cited

U.S. PATENT DOCUMENTS

| | | | |
|---|---|---|---|
| 2017/0076683 A1* | 3/2017 | Lee | G09G 3/3266 |
| 2017/0110050 A1* | 4/2017 | Park | G09G 3/3208 |
| 2017/0186363 A1* | 6/2017 | Park | G09G 3/3266 |
| 2022/0157250 A1 | 5/2022 | Kim et al. | |

FOREIGN PATENT DOCUMENTS

| | | |
|---|---|---|
| KR | 1020150142708 A | 12/2015 |
| KR | 1020210043773 A | 4/2021 |
| KR | 1020220000022 A | 1/2022 |
| KR | 1020220000023 A | 1/2022 |

* cited by examiner

*Primary Examiner* — Sepehr Azari
(74) *Attorney, Agent, or Firm* — CANTOR COLBURN LLP

(57) ABSTRACT

A scan driver includes a plurality of stages. Each of the plurality of stages includes a control circuit which controls a voltage of a first node and a voltage of a second node in response to an input signal, a first clock signal and a second clock signal, a carry output circuit which outputs a carry signal in response to the voltage of the first node and the voltage of the second node, an enable node controlling circuit which controls a voltage of an enable node in response to the carry signal, an enable signal and an inverted enable signal, a masking circuit which controls a voltage of a third node in response to the voltage of the second node and the voltage of the enable node, and a scan output circuit which outputs a scan signal in response to the voltage of the first node and the voltage of the third node.

20 Claims, 21 Drawing Sheets

SCAN DRIVER AND DISPLAY DEVICE

This application claims priority to Korean Patent Application No. 10-2022-0148690, filed on Nov. 9, 2022, and all the benefits accruing therefrom under 35 U.S.C. § 119, the content of which in its entirety is herein incorporated by reference.

BACKGROUND

1. Field

Embodiments of the inventive concept relate to a display device, and more particularly to a scan driver in a display device performing multi-frequency driving ("MFD"), and the display device including the scan driver.

2. Description of the Related Art

Reduction of power consumption may be beneficial in a display device employed in a portable device, such as a smartphone, a tablet computer, etc. In order to reduce the power consumption of display devices, a low frequency driving technique, which drives or refreshes a display panel at a frequency lower than a normal driving frequency, may be utilized.

SUMMARY

In a display device to which the low frequency driving technique is applied, when a still image is not displayed in an entirety of the region of a display panel, or when the still image is displayed only in a partial region of the display panel, the entirety of the region of the display panel may be driven at the normal driving frequency. Thus, in this case, the low frequency driving may not be performed, and the power consumption may not be reduced.

Some embodiments provide a scan driver capable of providing scan signals at different driving frequencies to respective regions of a display panel.

Some embodiments provide a display device including the scan driver.

In an embodiment of the disclosure, there is provided a scan driver including a plurality of stages. Each of the plurality of stages includes a control circuit which controls a voltage of a first node and a voltage of a second node in response to an input signal, a first clock signal and a second clock signal, a carry output circuit which outputs a carry signal in response to the voltage of the first node and the voltage of the second node, an enable node controlling circuit which controls a voltage of an enable node in response to the carry signal, an enable signal and an inverted enable signal, a masking circuit which controls a voltage of a third node in response to the voltage of the second node and the voltage of the enable node, and a scan output circuit which outputs a scan signal in response to the voltage of the first node and the voltage of the third node.

In an embodiment, in a case where the enable signal has a first level before the carry signal having the first level is output, the enable node controlling circuit may control the voltage of the enable node to a second level. While the carry signal having the first level is output, the masking circuit may control the voltage of the third node to the second level in response to the voltage of the enable node having the second level, and the scan output circuit may output the scan signal having the first level in response to the voltage of the third node having the second level.

In an embodiment, in a case where the enable signal is changed from the first level to the second level while the carry signal having the first level is output, the enable node controlling circuit may hold the voltage of the enable node as the second level until outputting the carry signal having the first level is completed.

In an embodiment, in a case where the enable signal has a second level before the carry signal having a first level is output, the enable node controlling circuit may control the voltage of the enable node to the first level. While the carry signal having the first level is output, the masking circuit may control the voltage of the third node to the first level in response to the voltage of the enable node having the first level, and the scan output circuit may not output the scan signal having the first level in response to the voltage of the third node having the first level.

In an embodiment, in a case where the enable signal is changed from the second level to the first level while the carry signal having the first level is output, the enable node controlling circuit may hold the voltage of the enable node as the first level until outputting the carry signal having the first level is completed.

In an embodiment, while the carry signal having a first level is output, the enable node controlling circuit may hold the voltage of the enable node as a previous level.

In an embodiment, when the carry signal having a first level is not output, the enable signal has the first level, and the inverted enable signal has a second level, the enable node controlling circuit may control the voltage of the enable node to the second level. When the carry signal having the first level is not output, the enable signal has the second level, and the inverted enable signal has the first level, the enable node controlling circuit may control the voltage of the enable node to the first level.

In an embodiment, the enable node controlling circuit may include first and second transistors coupled in series between a high gate voltage line and the enable node, the first transistor being turned on in response to the carry signal, the second transistor being turned on in response to the enable signal, and third and fourth transistors coupled in series between the enable node and a low gate voltage line, the third transistor being turned on in response to the inverted enable signal, the fourth transistor being turned on in response to the carry signal.

In an embodiment, the first transistor may include a gate receiving the carry signal, a first terminal coupled to the high gate voltage line, and a second terminal, the second transistor may include a gate receiving the enable signal, a first terminal coupled to the second terminal of the first transistor, and a second terminal coupled to the enable node, the third transistor may include a gate receiving the inverted enable signal, a first terminal coupled to the enable node, and a second terminal, and the fourth transistor may include a gate receiving the carry signal, a first terminal coupled to the second terminal of the third transistor, and a second terminal coupled to the low gate voltage line.

In an embodiment, the enable node controlling circuit may further include a first capacitor coupled between the enable node and the low gate voltage line.

In an embodiment, the masking circuit may separate the second node from the third node when the voltage of the enable node has a first level, and may couple the second node to the third node when the voltage of the enable node has a second level.

In an embodiment, the masking circuit may include a fifth transistor which selectively couples the second node to the third node in response to the voltage of the enable node.

In an embodiment, the fifth transistor may include a gate coupled to the enable node, a first terminal coupled to the second node, and a second terminal coupled to the third node.

In an embodiment, the masking circuit may further include a second capacitor coupled between a high gate voltage line and the third node, and sixth and seventh transistors coupled in series between the high gate voltage line and the third node, the sixth transistor being turned on in response to the carry signal, the seventh transistor being turned on in response to the enable signal.

In an embodiment, the sixth transistor may include a gate receiving the carry signal, a first terminal coupled to the high gate voltage line, and a second terminal, and the seventh transistor may include a gate receiving the enable signal, a first terminal coupled to the second terminal of the sixth transistor, and a second terminal coupled to the third node.

In an embodiment, the carry output circuit may include an eighth transistor including a gate coupled to the second node, a first terminal coupled to a high gate voltage line, and a second terminal coupled to a carry output node, and a ninth transistor including a gate coupled to the first node, a first terminal coupled to the carry output node, and a second terminal coupled to a low gate voltage line.

In an embodiment, the scan output circuit may include a tenth transistor including a gate coupled to the third node, a first terminal coupled to a high gate voltage line, and a second terminal coupled to a scan output node, and an eleventh transistor including a gate coupled to the first node, a first terminal coupled to the scan output node, and a second terminal coupled to a low gate voltage line.

In an embodiment, transistors included in each of the plurality of stages may be implemented with p-type metal-oxide-semiconductor ("PMOS") transistors.

In an embodiment, the carry signal and the scan signal may be active high signals having a high level as an active level.

In an embodiment of the disclosure, there is provided a display device including a display panel including a plurality of pixels, a data driver which provides a data signal to each of the plurality of pixels, a scan driver which provides a scan signal to each of the plurality of pixels, and a controller which controls the data driver and the scan driver. The scan driver includes a plurality of stages. Each of the plurality of stages includes a control circuit which controls a voltage of a first node and a voltage of a second node in response to an input signal, a first clock signal and a second clock signal, a carry output circuit which outputs a carry signal in response to the voltage of the first node and the voltage of the second node, an enable node controlling circuit which controls a voltage of an enable node in response to the carry signal, an enable signal and an inverted enable signal, a masking circuit which controls a voltage of a third node in response to the voltage of the second node and the voltage of the enable node, and a scan output circuit which outputs a scan signal in response to the voltage of the first node and the voltage of the third node.

As described above, in a scan driver and a display device in embodiments, each stage may include an enable node controlling circuit that controls a voltage of an enable node according to an enable signal, and holds the voltage of the enable node while a carry signal is output, and a masking circuit that selectively couples a second node and a third node in response to the voltage of the enable node. Accordingly, each of scan signals generated by the scan driver in embodiments may have a time length corresponding to two or more horizontal times, and the scan signals may be provided at different driving frequencies to respective regions of a display panel.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
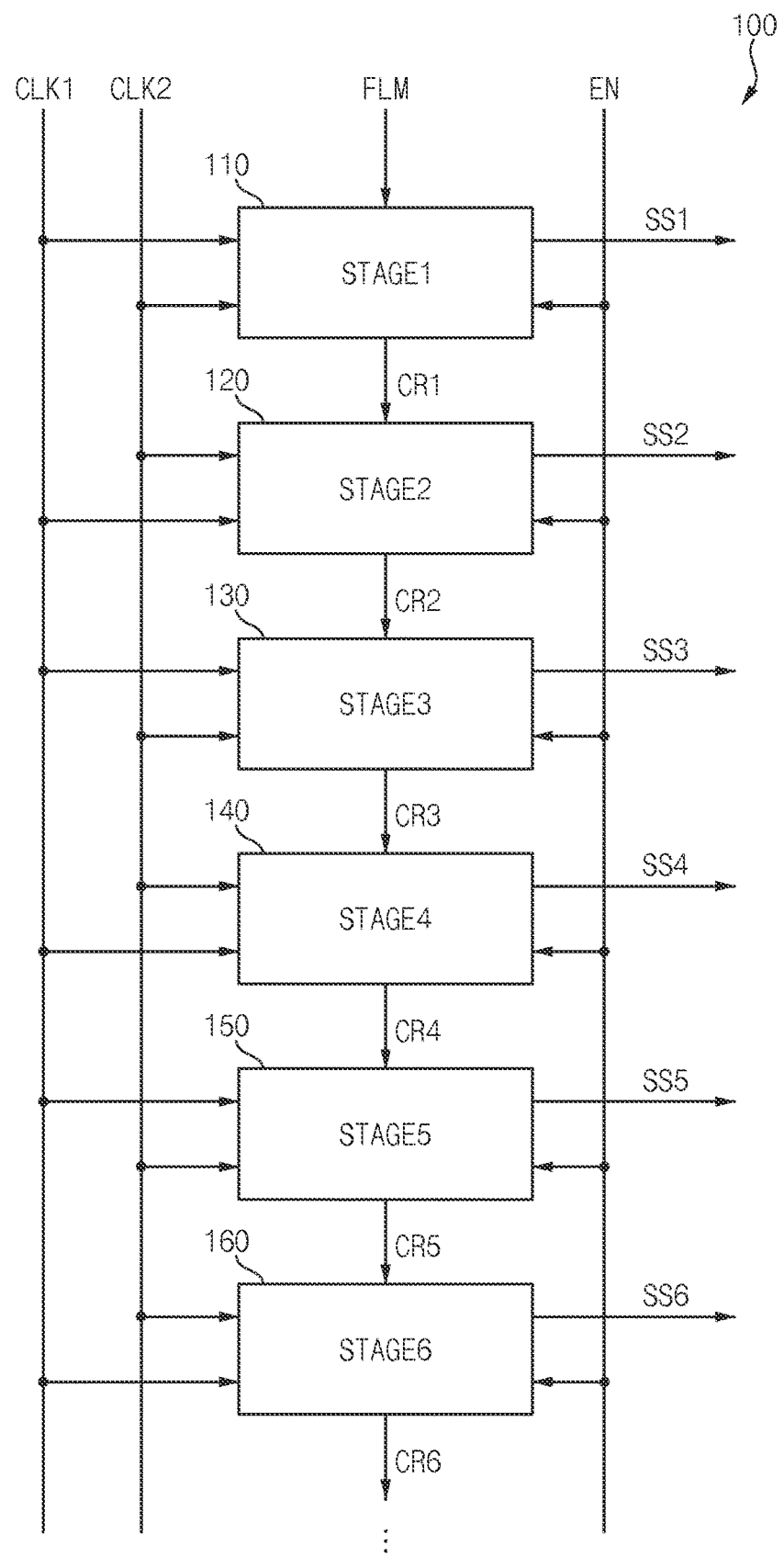
FIG. 1 is a block diagram illustrating an embodiment of a scan driver.

Hereinafter, embodiments of the inventive concept will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
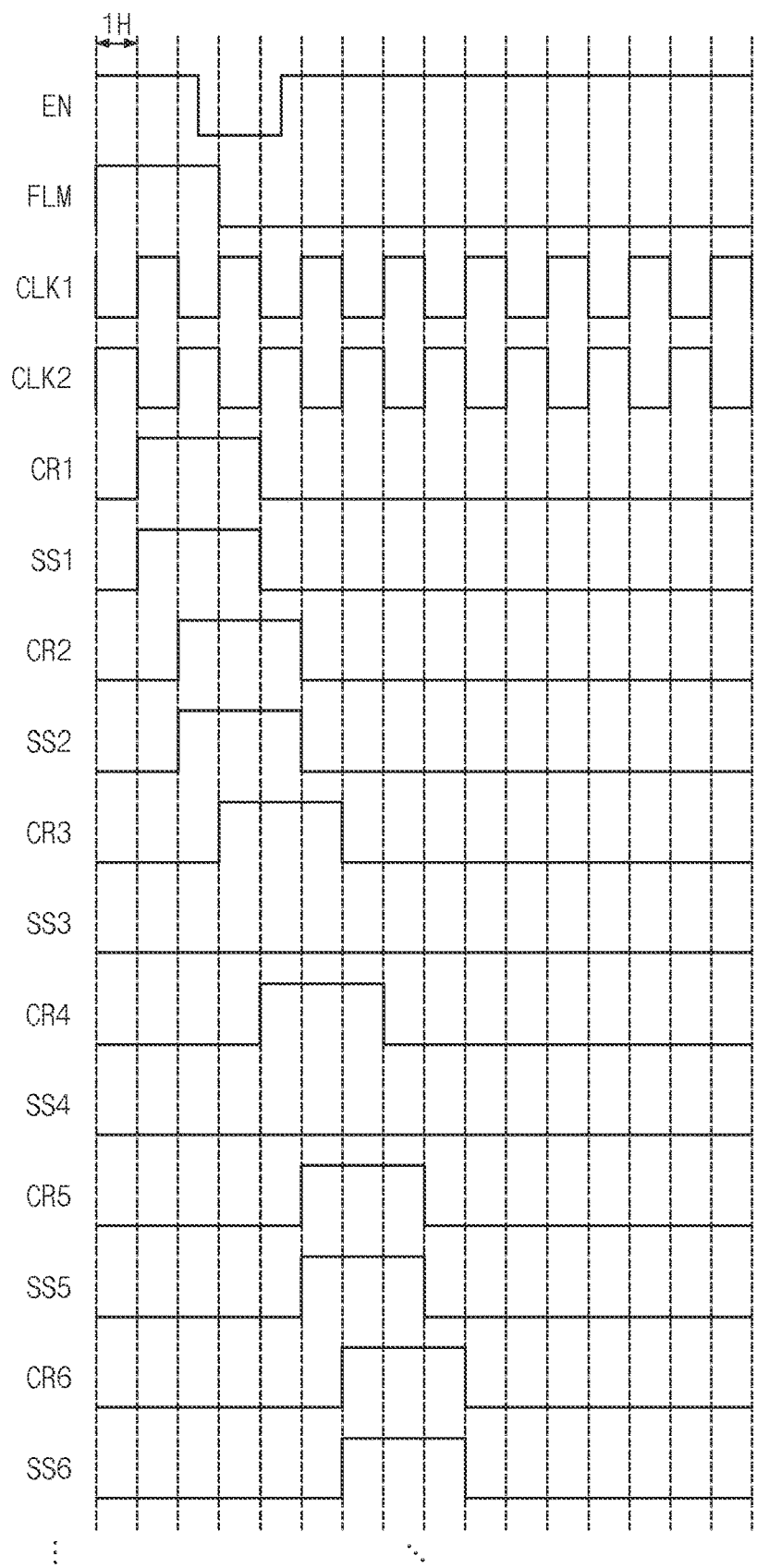
FIG. 2 is a timing diagram for describing an embodiment of an operation of a scan driver.

FIG. 1 is a block diagram illustrating an embodiment of a scan driver, and FIG. 2 is a timing diagram for describing an embodiment of an operation of a scan driver.

Referring to FIG. 1, a scan driver 100 in embodiments may include a plurality of stages 110, 120, 130, 140, 150, 160, . . . .

The plurality of stages 110, 120, 130, 140, 150, 160, . . . may receive a first clock signal CLK1, a second clock signal CLK2, a scan start signal FLM and an enable signal EN. In some embodiments, the plurality of stages 110, 120, 130, 140, 150, 160, . . . may further receive an inverted enable signal that is an inverted signal of the enable signal EN. The first clock signal CLK1 and the second clock signal CLK2 may have different phases from each other. In an embodiment, as illustrated in FIG. 2, the first clock signal CLK1 and the second clock signal CLK2 may have opposite phases, for example.

The plurality of stages 110, 120, 130, 140, 150, 160, . . . may sequentially generate carry signals CR1, CR2, CR3, CR4, CR5, CR6, . . . . In some embodiments, odd-numbered stages 110, 130, 150, . . . may receive an input signal (e.g., the scan start signal FLM or a previous carry signal CR2, CR4, . . . ) having a first level (e.g., a relatively high level) in response to the first clock signal CLK1 having a second level (e.g., a relatively low level), and may initiate (or start) outputting the carry signal CR1, CR3, CR5, . . . having the first level in response to the second clock signal CLK2 having the second level. Hereinafter, the relatively high level may be referred to as a high level, and the relatively low level may be referred to as a low level for convenience. Further, even-numbered stages 120, 140, 160, . . . may receive an input signal (e.g., a previous carry signal CR1, CR3, CR5, . . . ) having the first level in response to the second clock signal CLK2 having the second level, and may initiate outputting the carry signal CR2, CR4, CR6, . . . having the first level in response to the first clock signal CLK1 having the second level.

In an embodiment, as illustrated in FIG. 2, a first stage STAGE1 or 110 may receive the scan start signal FLM in response to the first clock signal CLK1 having the low level, and may initiate outputting a first carry signal CR1 having the high level in response to the second clock signal CLK2 having the low level, for example. Further, a second stage STAGE2 or 120 may receive the first carry signal CR1 in response to the second clock signal CLK2 having the low level, and may initiate outputting a second carry signal CR2 having the high level in response to the first clock signal CLK1 having the low level. Further, a third stage STAGE3 or 130 may receive the second carry signal CR2 in response to the first clock signal CLK1 having the low level, and may initiate outputting a third carry signal CR3 having the high level in response to the second clock signal CLK2 having the low level. Further, a fourth stage STAGE4 or 140 may receive the third carry signal CR3 in response to the second clock signal CLK2 having the low level, and may initiate outputting a fourth carry signal CR4 having the high level in response to the first clock signal CLK1 having the low level.

Further, a fifth stage STAGE5 or 150 may receive the fourth carry signal CR4 in response to the first clock signal CLK1 having the low level, and may initiate outputting a fifth carry signal CR5 having the high level in response to the second clock signal CLK2 having the low level. Further, a sixth stage STAGE6 and 160 may receive the fifth carry signal CR5 in response to the second clock signal CLK2 having the low level, and may initiate outputting a sixth carry signal CR6 having the high level in response to the first clock signal CLK1 having the low level.

In some embodiments, as illustrated in FIG. 2, each carry signal CR1, CR2, CR3, CR4, CR5, CR6, ... may be an active high signal having the high level as an active level, and an active period of each carry signal CR1, CR2, CR3, CR4, CR5, CR6, ... may have a time length longer than one horizontal time 1H (i.e., a time allocated for each pixel row of a display panel). In an embodiment, the active period of each carry signal CR1, CR2, CR3, CR4, CR5, CR6, ... may have a time length corresponding to two or more horizontal times, for example. Thus, active periods of adjacent carry signals (e.g., the first through third carry signals CR1, CR2 and CR3) may overlap in time. Although FIG. 2 illustrates an embodiment where the active period of each carry signal CR1, CR2, CR3, CR4, CR5, CR6, ... has a time length corresponding to three horizontal times, the time length of the active period of each carry signal CR1, CR2, CR3, CR4, CR5, CR6, ... may correspond to any number of horizontal times.

The plurality of stages 110, 120, 130, 140, 150, 160, ... may selectively and respectively output scan signals SS1, SS2, SS3, SS4, SS5, SS6, ... according to a level of the enable signal EN. In some embodiments, each stage (e.g., the first stage 110) may output a scan signal (e.g., a first scan signal SS1) having a phase substantially the same as a phase of a carry signal (e.g., the first carry signal CR1) in a case where the enable signal EN having the first level (e.g., the high level) when outputting the carry signal having the first level is initiated (or started). Even when the enable signal EN is changed from the first level to the second level (e.g., the low level) while the carry signal having the first level is output or while the scan signal having the first level is output, the stage may continue outputting the scan signal having the first level until outputting the carry signal having the first level is completed. Further, in a case where the enable signal EN having the second level (e.g., the low level) when outputting the carry signal having the first level is initiated, each stage (e.g., the first stage 110) may not output the scan signal having the first level. Even when the enable signal EN is changed from the second level to the first level while the carry signal having the first level is output, the stage may not output the scan signal.

In an embodiment, as illustrated in FIG. 2, in a case where the enable signal EN has the high level when outputting the first carry signal CR1 having the high level is initiated and when the second carry signal CR2 having the high level is initiated, the first stage STAGE1 or 110 and the second stage STAGE2 or 120 may sequentially and respectively output a first scan signal SS1 having the high level and a second scan signal SS2 having the high level, for example. Although the enable signal EN is changed from the high level to the low level while the first and second carry signals CR1 and CR2 are output or while the first and second scan signals SS1 and SS2 are output, the first stage STAGE1 or 110 may continue outputting the first scan signal SS1 having the high level until outputting the first carry signal CR1 having the high level is completed, and the second stage STAGE2 or 120 may continue outputting the second scan signal SS2 having the high level until outputting the second carry signal CR2 having the high level is completed Further, in a case where the enable signal EN has the low level when outputting the third carry signal CR3 having the high level is initiated and when outputting the fourth carry signal CR4 having the high level is initiated, the third stage STAGE3 or 130 and the fourth stage STAGE4 or 140 may not output the third scan signal SS3 having the high level and the fourth scan signal SS4 having the high level. Although the enable signal EN is changed from the low level to the high level while the third and fourth carry signals CR3 and CR4 are output, the third stage STAGE3 or 130 and the fourth stage STAGE4 or 140 may not output the third scan signal SS3 having the high level and the fourth scan signal SS4 having the high level. Further, in a case where the enable signal EN has the high level when outputting the fifth carry signal CR5 having the high level is initiated and when the sixth carry signal CR6 having the high level is initiated, the fifth stage STAGE5 or 150 and the sixth stage STAGE6 and 160 may sequentially and respectively output a fifth scan signal SS5 having the high level and a sixth scan signal SS6 having the high level.

Further, in some embodiments, as illustrated in FIG. 2, each scan signal SS1, SS2, SS3, SS4, SS5, SS6, ... may be an active high signal having the high level as an active level, and an active period of each scan signal SS1, SS2, SS3, SS4, SS5, SS6, ... may have a time length longer than one horizontal time 1H (i.e., the time allocated for each pixel row of the display panel). In an embodiment, the active period of each scan signal SS1, SS2, SS3, SS4, SS5, SS6, ... may have a time length corresponding to two or more horizontal times, for example. Thus, active periods of adjacent scan signals (e.g., the first and second scan signals SS1 and SS2) may overlap in time. Although FIG. 2 illustrates an embodiment where the active period of each scan signal SS1, SS2, SS3, SS4, SS5, SS6, ... has a time length corresponding to three horizontal times, the time length of the active period of each scan signal SS1, SS2, SS3, SS4, SS5, SS6, ... may correspond to any number of horizontal times.

As described above, the plurality of stages 110, 120, 130, 140, 150, 160, ... may selectively and respectively output the scan signals SS1, SS2, SS3, SS4, SS5, SS6, ... according to the level of the enable signal EN, and thus the scan driver 100 in embodiments may provide the scan signals SS1, SS2, SS3, SS4, SS5, SS6, ... at different driving frequencies to respective regions of the display panel.

Further, as described above, in a case where the enable signal EN has the first level when outputting a corresponding carry signal is initiated, even when the enable signal EN is changed to the second level while the corresponding carry signal is output, each stage 110, 120, 130, 140, 150, 160, ... may output a scan signal of which the active period has a time length of two or more horizontal times. In addition, in a case where the enable signal EN has the second level when outputting the corresponding carry signal is initiated, even when the enable signal EN is changed to the first level while the corresponding carry signal is output, each stage 110, 120, 130, 140, 150, 160, ... may not output the scan signal having the first level. Accordingly, the scan driver 100 in embodiments may selectively provide the scan signals SS1, SS2, SS3, SS4, SS5, SS6, ... of which the active period has the time length of two or more horizontal times.

Figure 3:
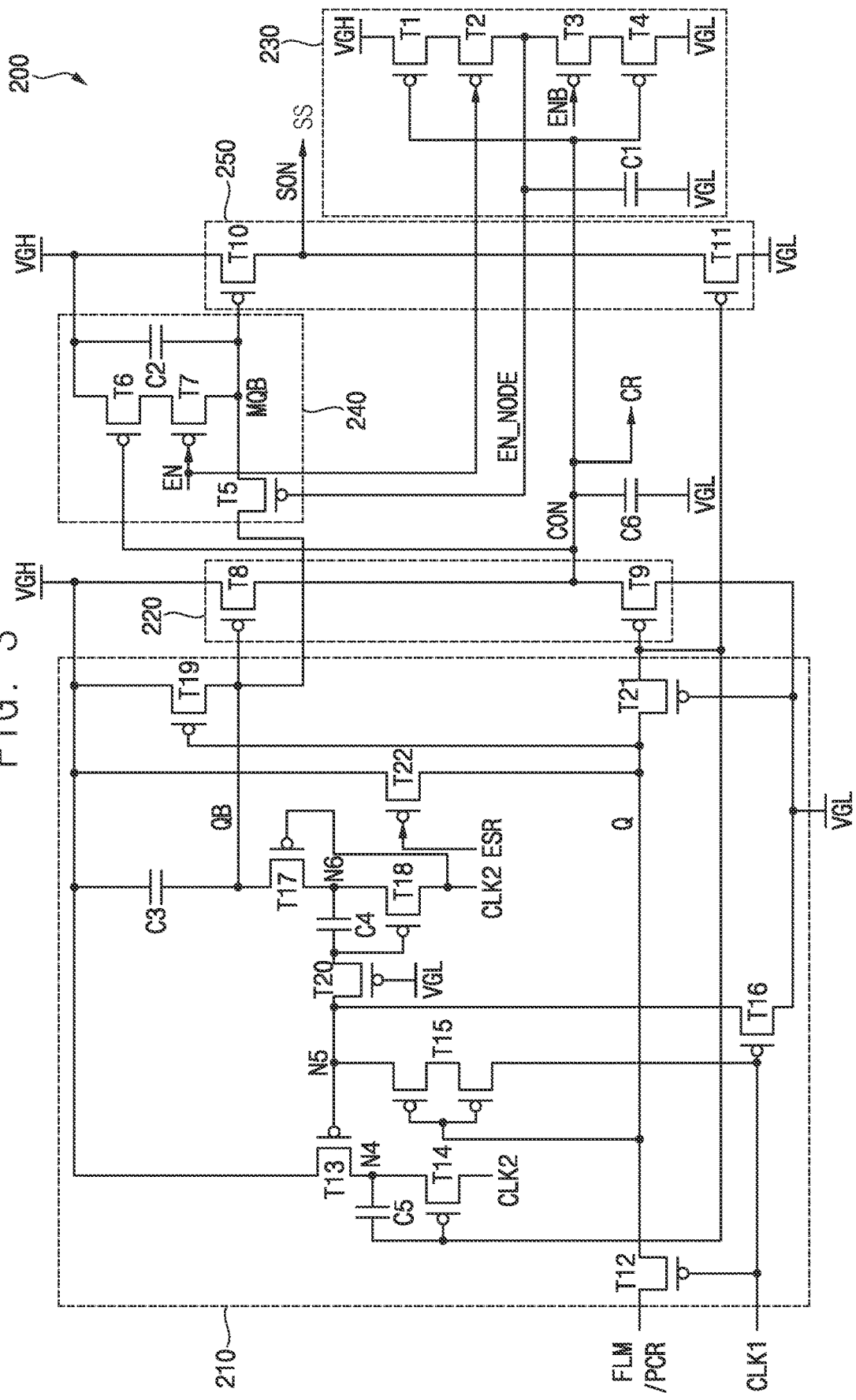
FIG. 3 is a circuit diagram illustrating an embodiment of each stage included in a scan driver.

FIG. 3 is a circuit diagram illustrating an embodiment of each stage included in a scan driver.

Referring to FIG. 3, each stage 200 of a scan driver in embodiments may include a control circuit 210 that controls a voltage of a first node Q and a voltage of a second node QB in response to an input signal FLM/PCR, a first clock signal CLK1 and a second clock signal CLK2, a carry output circuit 220 that outputs a carry signal CR in response to the voltage of the first node Q and the voltage of the second node QB, an enable node controlling circuit 230 that controls a voltage of an enable node EN_NODE in response to the carry signal CR, an enable signal EN and an inverted enable signal ENB, a masking circuit 240 that controls a voltage of a third node MQB in response to the voltage of the second node QB and the voltage of the enable node EN_NODE, and a scan output circuit 250 that outputs a scan signal SS in response to the voltage of the first node Q and the voltage of the third node MQB. In some embodiments, each stage 200 may further include a sixth capacitor C6 coupled to a carry output node CON at which the carry signal CR is output, and/or a seventh capacitor (not shown) coupled to a scan output node SON at which the scan signal SS is output.

When the input signal FLM/PCR having a first level (e.g., a high level) is not received, the control circuit 210 may control the voltage of the first node Q to a second level (e.g., a low level), and may control the voltage of the second node QB to the first level. The input signal FLM/PCR may be a scan start signal FLM with respect to a first stage, and may be a previous carry signal PCR, or the carry signal CR of a previous stage with respect to subsequent stages.

Figure 4:
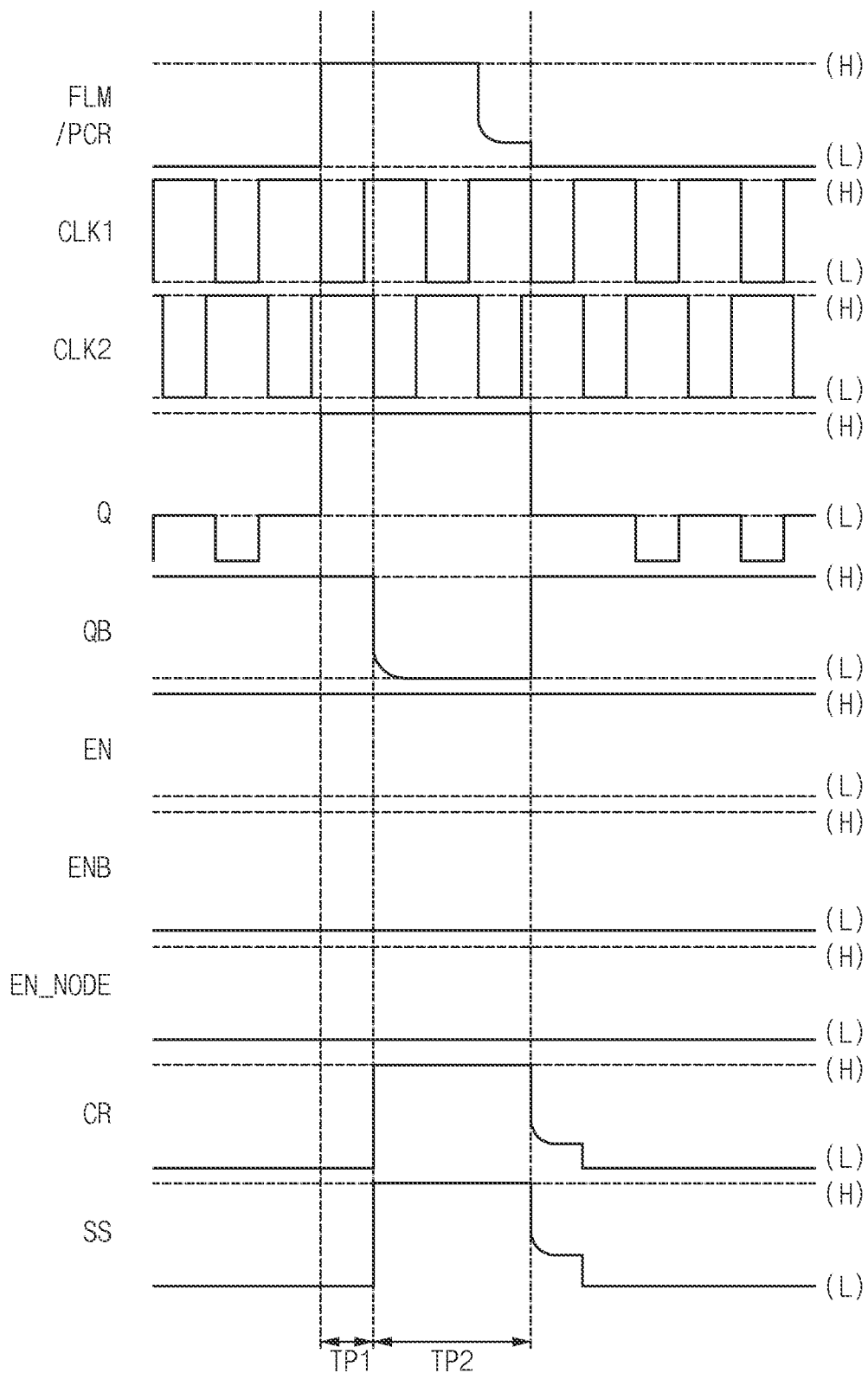
FIG. 4 is a timing diagram for describing an embodiment of an operation of a stage of FIG. 3 when an enable signal has a first level.

Further, as illustrated in FIGS. 3 and 4, the control circuit 210 (of an odd-numbered stage 200) may control the voltage of the first node Q to the first level in response to the first clock signal CLK1 having the second level and the input signal FLM/PCR having the first level, and may control the voltage of the second node QB to the second level in response to the second clock signal CLK2 having the second level and the voltage of the first node Q having the first level. In an alternative embodiment, with respect to an even-numbered stage, the control circuit 210 may control the voltage of the first node Q to the first level in response to the second clock signal CLK2 having the second level and the input signal FLM/PCR having the first level, and may control the voltage of the second node QB to the second level in response to the first clock signal CLK1 having the second level and the voltage of the first node Q having the first level.

The control circuit 210 may include twelfth through nineteenth transistors T12 through T19 and third through fifth capacitors C3 through C5. In some embodiments, the control circuit 210 may further include a twentieth transistor T20 disposed at a fifth node N5, a twenty-first transistor T21 disposed at the first node Q, and a twenty-second transistor T22 that applies a high gate voltage VGH to the first node Q in response to a global control signal ESR.

The twelfth transistor T12 may apply the input signal FLM/PCR to the first node Q in response to the first clock signal CLK1 having the low level. In an embodiment, the twelfth transistor T12 may include a gate receiving the first clock signal CLK1, a first terminal receiving the input signal FLM/PCR, and a second terminal coupled to the first node Q, for example.

The fifth capacitor C5 may include a first electrode coupled to the first node Q (through the twenty-first transistor T21), and a second electrode coupled to a fourth node N4. The thirteenth transistor T13 may apply the high gate voltage VGH to the fourth node N4 in response to a voltage of the fifth node N5, and the fourteenth transistor T14 may apply the second clock signal CLK2 to the fourth node N4 in response to the voltage of the first node Q (through the twenty-first transistor T21). By the fifth capacitor C5, the thirteenth transistor T13 and the fourteenth transistor T14, as illustrated in FIG. 4, when the second clock signal CLK2 becomes the high level H, the voltage of the first node Q may become a level lower than the low level L. In an embodiment, the thirteenth transistor T13 may include a gate coupled to the fifth node N5, a first terminal receiving the high gate voltage VGH, and a second terminal coupled to the fourth node N4, and the fourteenth transistor T14 may include a gate coupled to the first node Q (through the twenty-first transistor T21), a first terminal coupled to the fourth node N4, and a second terminal receiving the second clock signal CLK2, for example.

The fifteenth transistor T15 may apply the first clock signal CLK1 to the fifth node N5 in response to the voltage of the first node Q, and the sixteenth transistor T16 may apply a low gate voltage VGL to the fifth node N5 in response to the first clock signal CLKT. In an embodiment, the fifteenth transistor T15 may include a gate coupled to the first node Q, a first terminal coupled to the fifth node N5, and a second terminal receiving the first clock signal CLKT, and the sixteenth transistor T16 may include a gate receiving the first clock signal CLKT, a first terminal coupled to the fifth node N5, and a second terminal receiving the low gate voltage VGL, for example.

The third capacitor C3 may include a first electrode receiving the high gate voltage VGH and a second electrode coupled to the second node QB, and the fourth capacitor C4 may include a first electrode coupled to the fifth node N5 (through the twentieth transistor T20) and a second electrode coupled to a sixth node N6.

The seventeenth transistor T17 may couple the second node QB and the sixth node N6 in response to the second clock signal CLK2, and the eighteenth transistor T18 may apply the second clock signal CLK2 to the sixth node N6 in response to the voltage of the fifth node N5. In an embodiment, the seventeenth transistor T17 may include a gate receiving the second clock signal CLK2, a first terminal coupled to the second node QB, and a second terminal coupled to the sixth node N6, and the eighteenth transistor T18 may include a gate coupled to the fifth node N5 (through the twentieth transistor T20), a first terminal coupled to the sixth node N6, and a second terminal receiving the second clock signal CLK2, for example.

The nineteenth transistor T19 may apply the high gate voltage VGH to the second node QB in response to the voltage of the first node Q. In an embodiment, the nineteenth transistor T19 may include a gate coupled to the first node Q, a first terminal receiving the high gate voltage VGH, and a second terminal coupled to the second node QB, for example.

The twentieth transistor T20 may be disposed at the fifth node N5, and the twenty-first transistor T21 may be disposed at the first node Q. A gate of the twentieth transistor T20 and a gate of the twenty-first transistor T21 may receive the low gate voltage VGL.

The twenty-second transistor T22 may control the voltage of the first node Q to the high level in response to the global control signal ESR. In some embodiments, the global control signal ESR may be substantially simultaneously applied to a plurality of stages of the scan driver, and the plurality of stages may substantially simultaneously output the scan signals SS in response to the global control signal ESR. In an embodiment, the twenty-second transistor T22 may include a gate receiving the global control signal ESR, a first terminal receiving the high gate voltage VGH, and a second terminal coupled to the first node Q, for example.

Although FIG. 3 illustrates an embodiment of the control circuit 210 including the twelfth through twenty-second transistors T12 through T22 and the third through fifth capacitors C3 through C5, a configuration of the control circuit 210 of each stage 200 of the scan driver in embodiments is not limited to the embodiment of FIG. 3. That is, the control circuit 210 may have any configuration that controls the voltage of the first node Q and the voltage of the second node QB in response to the input signal FLM/PCR, the first clock signal CLK1 and the second clock signal CLK2.

While the voltage of the first node Q has the first level (e.g., the high level), and the voltage of the second node QB has the second level (e.g., the low level), the carry output circuit 220 may output the carry signal CR having the first level (e.g., the high level). In some embodiments, the carry output circuit 220 may include an eighth transistor T8 that outputs the high gate voltage VGH as the carry signal CR in response to the voltage of the second node QB, and a ninth transistor T9 that outputs the low gate voltage VGL as the carry signal CR in response to the voltage of the first node Q. In an embodiment, the eighth transistor T8 may include a gate coupled to the second node QB, a first terminal coupled to a line (also referred to as a high gate voltage line) of the high gate voltage VGH, and a second terminal coupled to the carry output node CON at which the carry signal CR is output, and the ninth transistor T9 may include a gate coupled to the first node Q, a first terminal coupled to the carry output node CON, and a second terminal coupled to a line (also referred to as a low gate voltage line) of the low gate voltage VGL, for example.

When the carry signal CR having the first level (e.g., the high level) is not output, the enable signal EN has the first level, and the inverted enable signal ENB has the second level (e.g., the low level), the enable node controlling circuit 230 may control the voltage of the enable node EN_NODE to the second level. In an alternative embodiment, when the carry signal CR having the first level is not output, the enable signal EN has the second level, and the inverted enable signal ENB has the first level, the enable node controlling circuit 230 may control the voltage of the enable node EN_NODE to the first level. Further, while the carry signal CR having the first level is output, the enable node controlling circuit 230 may hold the voltage of the enable node EN_NODE as a previous level.

In some embodiments, the enable node controlling circuit 230 may include first and second transistors T1 and T2 coupled in series between the line of the high gate voltage VGH and the enable node EN_NODE, and third and fourth transistors T3 and T4 coupled in series between the enable node EN_NODE and the line of the low gate voltage VGL. The first transistor T1 may be turned on in response to the carry signal CR, the second transistor T2 may be turned on in response to the enable signal EN, the third transistor T3 may be turned on in response to the inverted enable signal ENB, and the fourth transistor T4 may be turned on in response to the carry signal CR. In an embodiment, the first transistor T1 may include a gate receiving the carry signal CR, a first terminal coupled to the line of the high gate voltage VGH, and a second terminal, the second transistor T2 may include a gate receiving the enable signal EN, a first terminal coupled to the second terminal of the first transistor T1, and a second terminal coupled to the enable node EN_NODE, the third transistor T3 may include a gate receiving the inverted enable signal ENB, a first terminal coupled to the enable node EN_NODE, and a second terminal, and the fourth transistor T4 may include a gate receiving the carry signal CR, a first terminal coupled to the second terminal of the third transistor T3, and a second terminal coupled to the line of the low gate voltage VGL, for example.

In some embodiments, the enable node controlling circuit 230 may further include a first capacitor C1 coupled between the enable node EN_NODE and the line of the low gate voltage VGL. In an embodiment, the first capacitor C1 may include a first electrode coupled to the enable node EN_NODE, and a second electrode coupled to the line of the low gate voltage VGL, for example.

The masking circuit 240 may separate the second node QB from the third node MQB when the voltage of the enable node EN_NODE has the first level (e.g., the high level), and may couple the second node QB to the third node MQB when the voltage of the enable node EN_NODE has the second level (e.g., the low level).

In some embodiments, the masking circuit 240 may include a fifth transistor T5 that selectively couples the second node QB to the third node MQB in response to the voltage of the enable node. In an embodiment, the fifth transistor T5 may include a gate coupled to the enable node EN_NODE, a first terminal coupled to the second node QB, and a second terminal coupled to the third node MQB, for example.

In some embodiments, the masking circuit 240 may further include a second capacitor C2 coupled between the line of the high gate voltage VGH and the third node MQB, and sixth and seventh transistors T6 and T7 coupled in series between the line of the high gate voltage VGH and the third node MQB. The sixth transistor T6 may be turned on in response to the carry signal CR, and the seventh transistor T7 may be turned on in response to the enable signal EN. In an embodiment, the sixth transistor T6 may include a gate receiving the carry signal CR, a first terminal coupled to the line of the high gate voltage VGH, and a second terminal, and the seventh transistor T7 may include a gate receiving the enable signal EN, a first terminal coupled to the second terminal of the sixth transistor T6, and a second terminal coupled to the third node MQB, for example.

The scan output circuit 250 may output the scan signal SS having the first level (e.g., the high level) while the voltage of the first node Q has the first level (e.g., the high level) and the voltage of the third node MQB has the second level (e.g., the low level). In some embodiments, the scan output circuit 250 may include a tenth transistor T10 that outputs the high gate voltage VGH as the scan signal SS in response to the voltage of the third node MQB, and an eleventh transistor T11 that outputs the low gate voltage VGL as the scan signal SS in response to the voltage of the first node Q. In an embodiment, the tenth transistor T10 may include a gate coupled to the third node MQB, a first terminal coupled to line of the high gate voltage VGH, and a second terminal coupled to the scan output node SON at which the scan signal SS is output, and the eleventh transistor T11 may include a gate coupled to the first node Q, a first terminal coupled to the scan output node SON, and a second terminal coupled to the line of the low gate voltage VGL, for example.

In some embodiments, the first through twenty-second transistors T1 through T22 included in each stage 200 may be implemented with, but not limited to, p-type metal-oxide-semiconductor ("PMOS") transistors. Even when the first through twenty-second transistors T1 through T22 are implemented with the PMOS transistors, each stage 200 of the scan driver in embodiments may generate the carry signal CR and the scan signal SS that are the active high signals having the high level as the active level. In other embodiments, a portion or all of the first through twenty-second transistors T1 through T22 may be implemented with, but not limited to, n-type metal-oxide-semiconductor ("NMOS") transistors.

In the stage 200 having the above configuration, in a case where the enable signal EN has the first level (e.g., the high level) before the carry signal CR having the first level is output, the enable node controlling circuit 230 may control the voltage of the enable node EN_NODE to the second level (e.g., the low level). While the carry signal CR having the first level is output, the masking circuit 240 may control the voltage of the third node MQB to a level of the voltage of the second node QB, or to the second level in response to the voltage of the enable node EN_NODE having the second level, and the scan output circuit 250 may output the scan signal SS having the first level in response to the voltage of the third node MQB having the second level. Even when the enable signal EN is changed from the first level to the second level while the carry signal CR having the first level is output, the enable node controlling circuit 230 may hold the voltage of the enable node EN_NODE as the second level until outputting the carry signal CR having the first level is completed. Accordingly, the scan signal SS of which an active period has a time length corresponding to two or more horizontal times may be normally output.

Further, in the stage 200, in a case where the enable signal EN has the second level before the carry signal CR having the first level is output, the enable node controlling circuit 230 may control the voltage of the enable node EN_NODE to the first level. While the carry signal CR having the first level is output, the masking circuit 240 may control the voltage of the third node MQB to the first level different from the level of the third node MQB in response to the voltage of the enable node EN_NODE having the first level, and the scan output circuit 250 may not output the scan signal SS having the first level in response to the voltage of the third node MQB having the first level. Even when the enable signal EN is changed from the second level to the first level while the carry signal CR having the first level is output, the enable node controlling circuit 230 may hold the voltage of the enable node EN_NODE as the first level until outputting the carry signal CR having the first level is completed. Accordingly, the scan signal SS having the first level may be prevented from being undesirably output by a level change of the enable signal EN.

Figure 5:
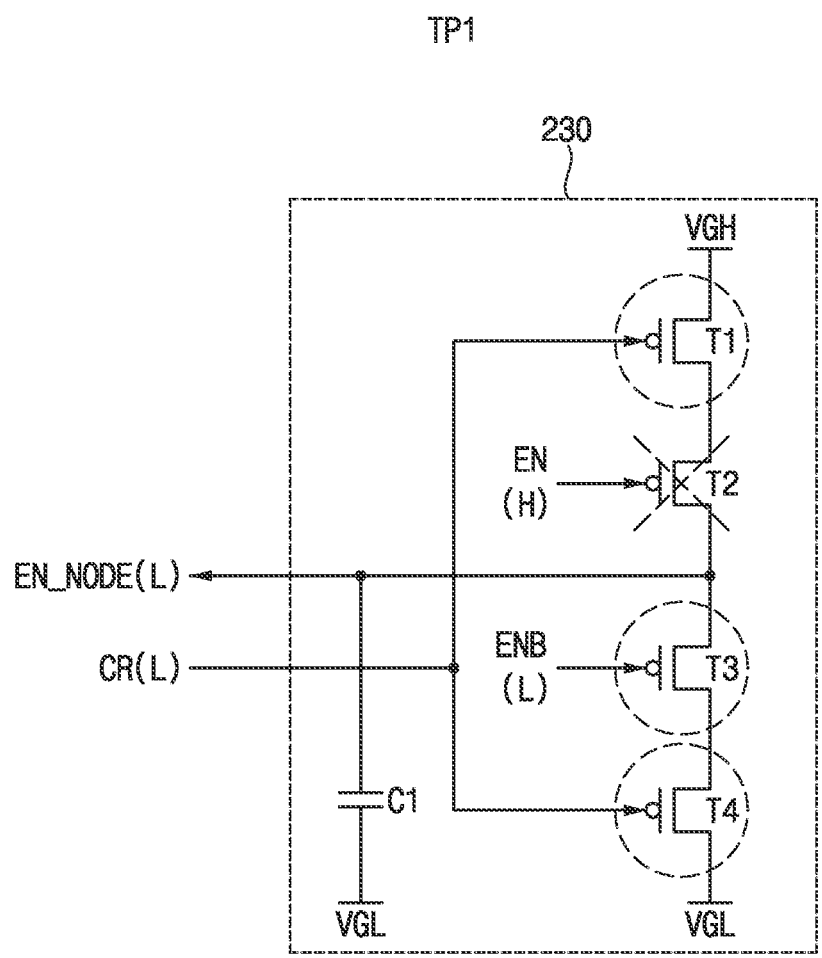
FIG. 5 is a circuit diagram for describing an operation of an enable node controlling circuit in a first time period.
Figure 6:
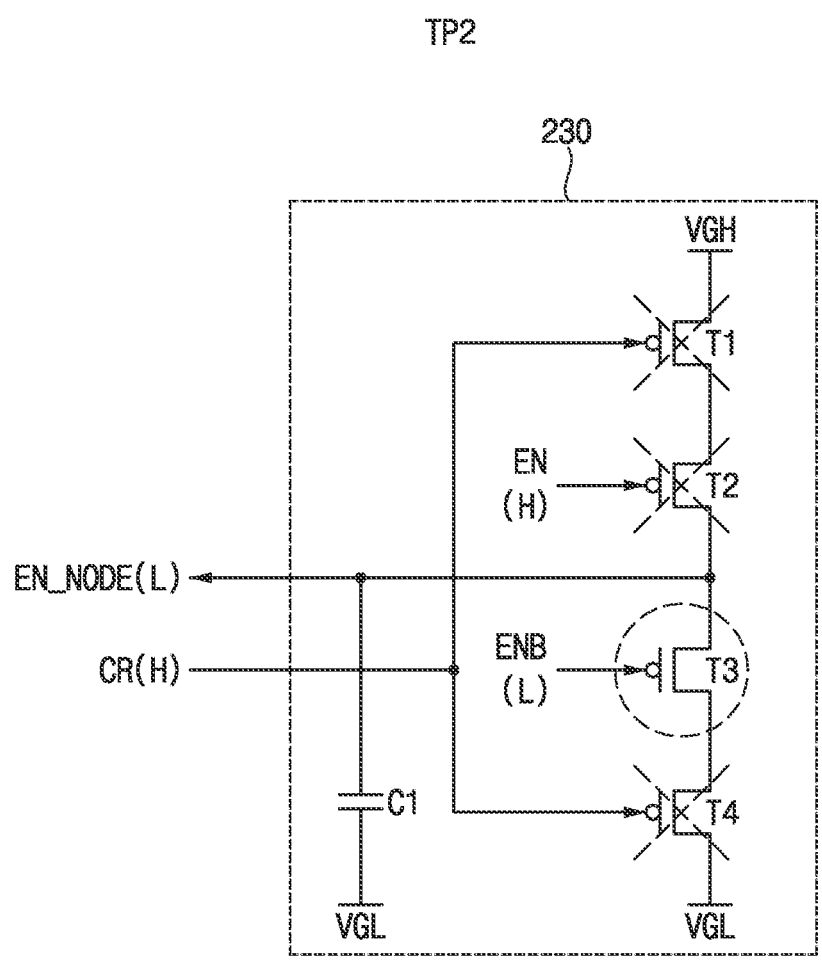
FIG. 6 is a circuit diagram for describing an operation of an enable node controlling circuit in a second time period.
Figure 7:
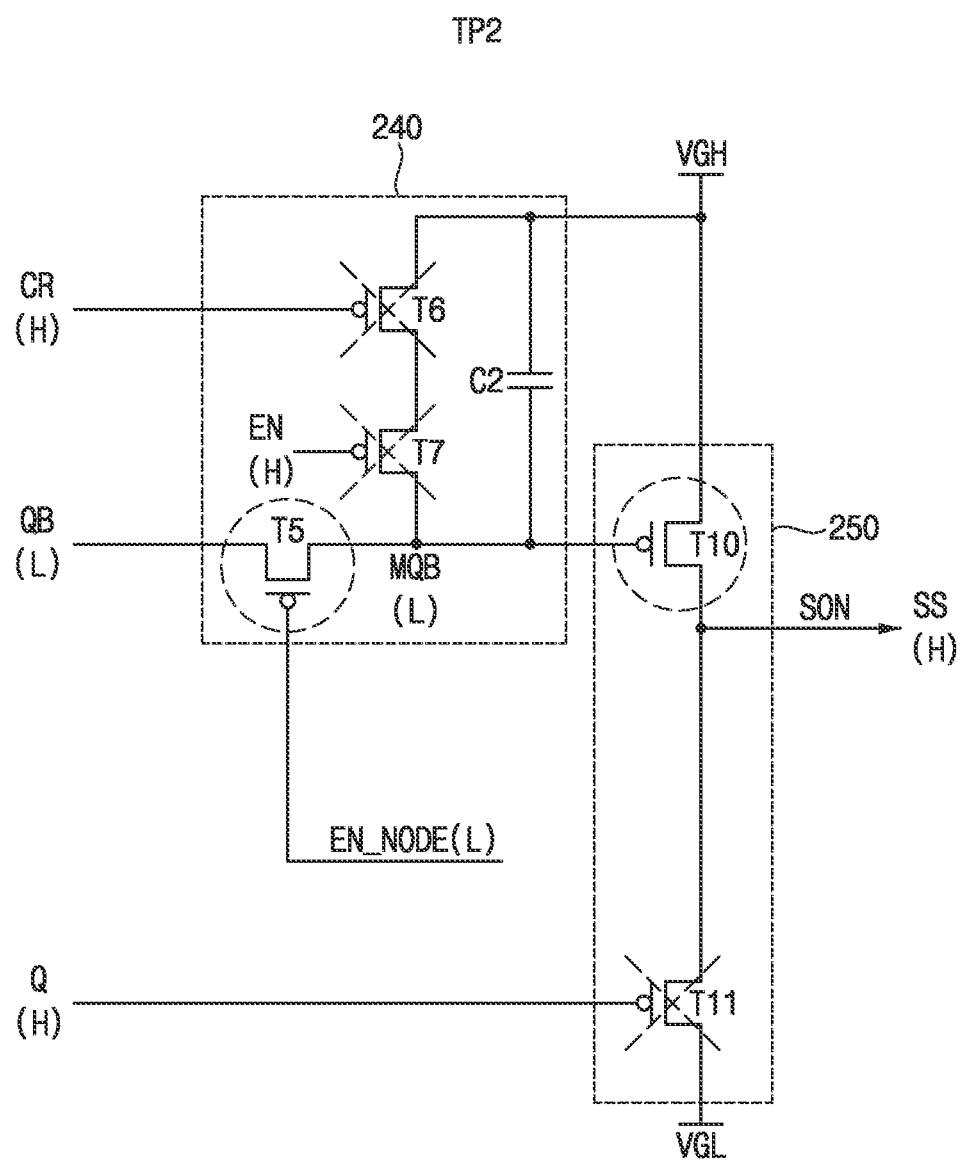
FIG. 7 is a circuit diagram for describing operations of a masking circuit and a scan output circuit in a second time period.

FIG. 4 is a timing diagram for describing an embodiment of an operation of a stage of FIG. 3 when an enable signal has a first level, FIG. 5 is a circuit diagram for describing an operation of an enable node controlling circuit in a first time period, FIG. 6 is a circuit diagram for describing an operation of an enable node controlling circuit in a second time period, and FIG. 7 is a circuit diagram for describing operations of a masking circuit and a scan output circuit in a second time period.

Referring to FIGS. 3 and 4, while an input signal FLM/PCR having a high level H is not received, and a carry signal CR having the high level H is not output, a control circuit 210 may control a voltage of a first node Q to a low level L (or a level lower than the low level L), and may control a voltage of a second node QB to the high level H. In response to the voltage of the first node Q having the low level L, a carry output circuit 220 may output the carry signal CR having the low level L, and a scan output circuit 250 may output a scan signal SS having the low level L.

In a first time period TP1, the input signal FLM/PCR having the high level H may be received, and a first clock signal CLK1 may have the low level L. The control circuit 210 may apply the input signal FLM/PCR having the high level H to the first node Q in response to the first clock signal CLK1 having the low level L. Thus, the voltage of the first node Q may have the high level H.

Further, in the first time period TP1, in a case where an enable signal EN has the high level H and an inverted enable signal ENB has the low level L, an enable node controlling circuit 230 may control a voltage of an enable node EN_NODE to the low level L. In an embodiment, as illustrated in FIG. 5, first and fourth transistors T1 and T4 may be turned on in response to the carry signal CR having the low level L, a second transistor T2 may be turned off in response to the enable signal EN having the high level H, and a third transistor T3 may be turned on in response to the inverted enable signal ENB having the low level L, for example. Thus, the third and fourth transistors T3 and T4 may apply a low gate voltage VGL to the enable node EN_NODE, and the voltage of the enable node EN_NODE may have the low level L.

In a second time period TP2 after the first time period TP1, the control circuit 210 may control the voltage of the second node QB to the low level L in response to a second clock signal CLK2 having the low level L. In an embodiment, seventeenth and eighteenth transistors T17 and T18 may apply the second clock signal CLK2 having the low level L to the second node QB in response to the second clock signal CLK2 having the low level L, for example. The carry output circuit 220 may output the carry signal CR having the high level H in response to the voltage of the second node QB having the low level L.

Further, in the second time period TP2, the enable node controlling circuit 230 may hold the voltage of the enable node EN_NODE as the low level L. In an embodiment, as illustrated in FIG. 6, the first and fourth transistors T1 and T4 may be turned off in response to the carry signal CR having the high level H, the second transistor T2 may be turned off in response to the enable signal EN having the high level H, and the third transistor T3 may be turned on in response to the inverted enable signal ENB having the low level L, for example. Thus, a high gate voltage VGH and the low gate voltage VGL may not be applied to the enable node EN_NODE, and a first capacitor C1 may hold the voltage of the enable node EN_NODE to a previous level, or the low level L.

Further, in the second time period TP2, a masking circuit 240 may control a voltage of a third node MQB to the low level L by coupling the second node QB to the third node MQB in response to the voltage of the enable node EN_NODE having the low level L, and the scan output circuit 250 may output the scan signal SS having the high level H in response to the voltage of the third node MQB having the low level L. In an embodiment, as illustrated in FIG. 7, a fifth transistor T5 may couple the second node QB to the third node MQB in response to the voltage of the enable node EN_NODE having the low level L, and thus the voltage of the third node MQB may have the level of the voltage of the second node QB, or the low level L, for example. Further, a sixth transistor T6 may be turned off in response to the carry signal CR having the high level H, and a seventh transistor T7 may be turned off in response to the enable signal EN having the high level H. In addition, a tenth transistor T10 may be turned on in response to the voltage of the third node MQB having the low level L, and an eleventh transistor T11 may be turned off in response to the voltage of the first node Q having the high level H. The tenth transistor T10 may apply the high gate voltage VGH to a scan output node SON, and thus the scan signal SS having the high level H may be output at the scan output node SON.

As described above, in a case where the enable signal EN has the high level H at a time point at which outputting the carry signal CR having the high level H is initiated, or at an end time point of the first period TP1 or a start time point of the second period TP2, a stage 200 may output the scan signal SS having the high level H.

Figure 8:
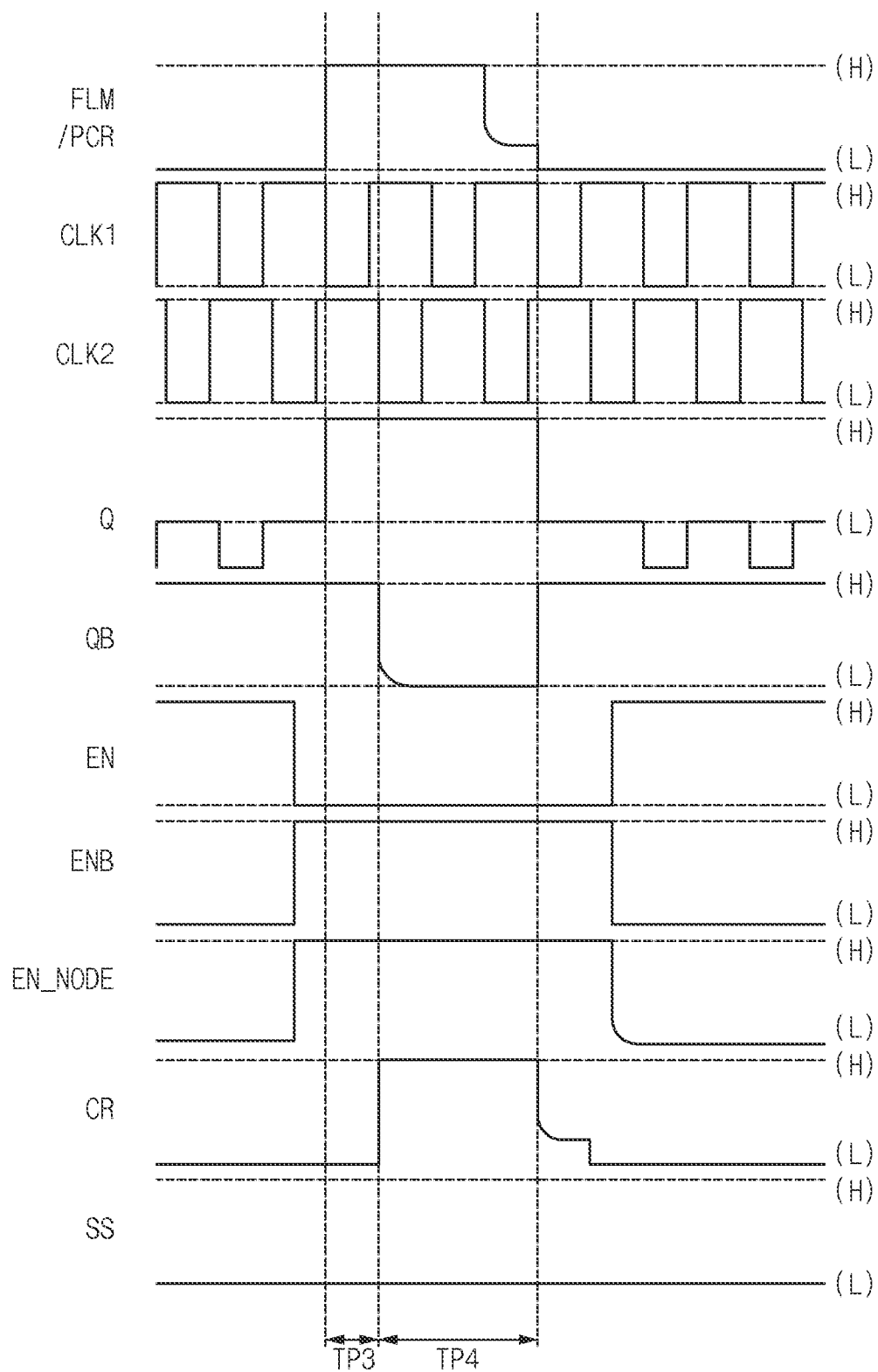
FIG. 8 is a timing diagram for describing an embodiment of an operation of a stage of FIG. 3 when an enable signal has a second level.
Figure 9:
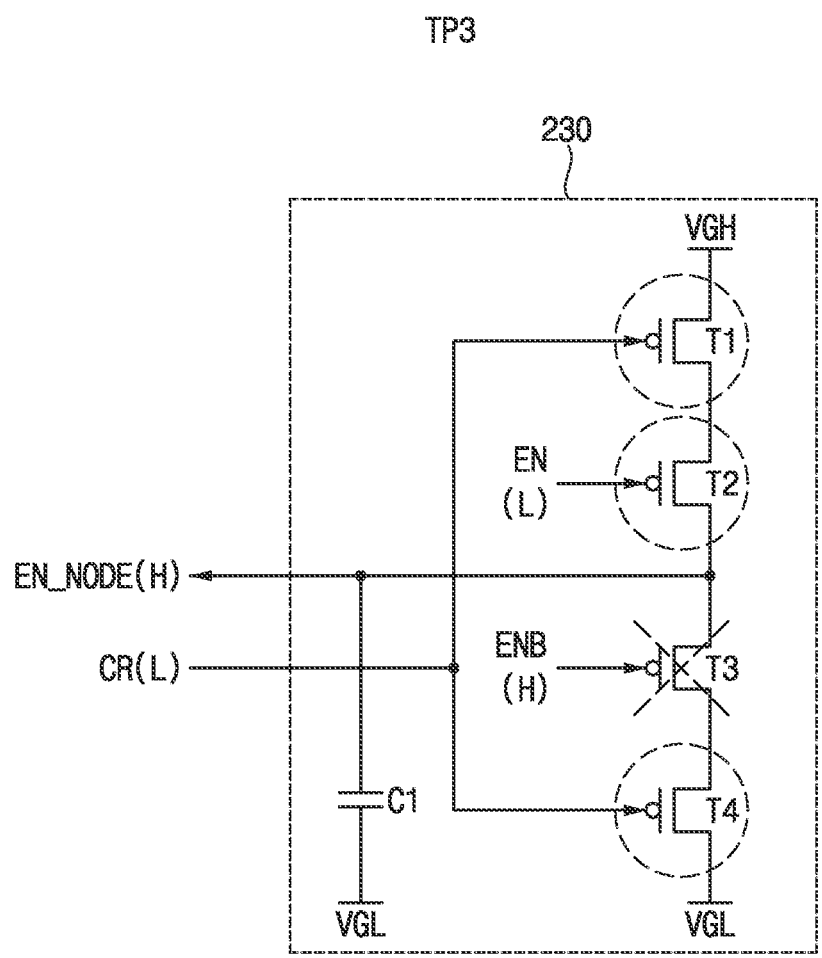
FIG. 9 is a circuit diagram for describing an operation of an enable node controlling circuit in a third time period.
Figure 10:
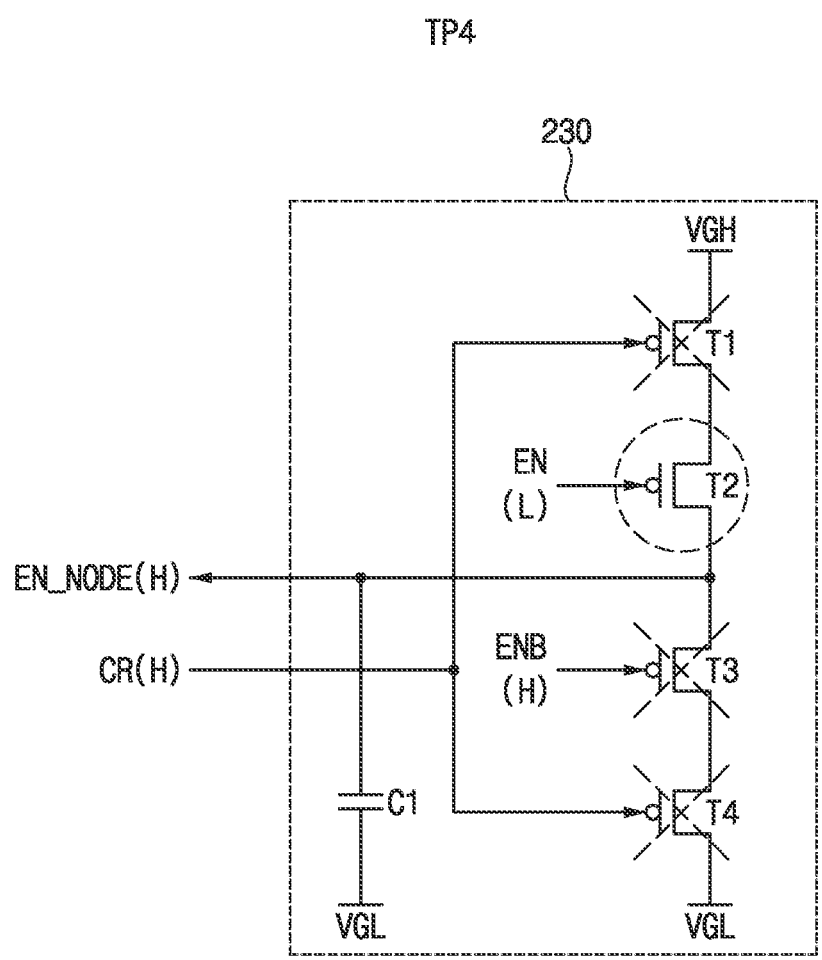
FIG. 10 is a circuit diagram for describing an operation of an enable node controlling circuit in a fourth time period.
Figure 11:
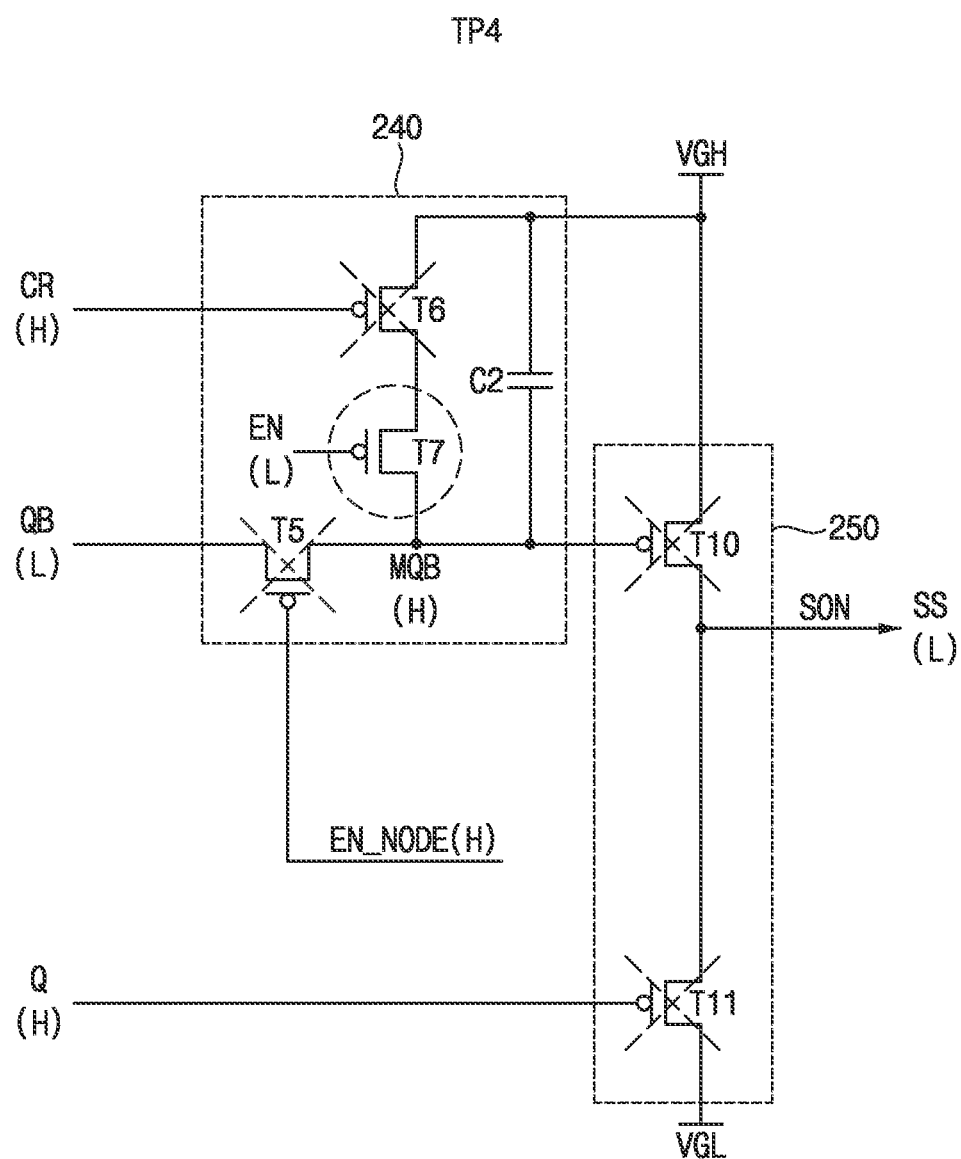
FIG. 11 is a circuit diagram for describing operations of a masking circuit and a scan output circuit in a fourth time period.

FIG. 8 is a timing diagram for describing an embodiment of an operation of a stage of FIG. 3 when an enable signal has a second level, FIG. 9 is a circuit diagram for describing an operation of an enable node controlling circuit in a third time period, FIG. 10 is a circuit diagram for describing an operation of an enable node controlling circuit in a fourth time period, and FIG. 11 is a circuit diagram for describing operations of a masking circuit and a scan output circuit in a fourth time period.

Referring to FIGS. 3 and 8, in a third time period TP3, an input signal FLM/PCR having a high level H may be received, and a first clock signal CLK1 may have a low level L. A control circuit 210 may apply the input signal FLM/PCR having the high level H to a first node Q in response to the first clock signal CLK1 having the low level L. Thus, a voltage of the first node Q may have the high level H.

Further, in the third time period TP3, in a case where an enable signal EN has the low level L and an inverted enable signal ENB has the high level H, an enable node controlling circuit 230 may control a voltage of an enable node EN_NODE to the high level H. In an embodiment, as illustrated in FIG. 9, first and fourth transistors T1 and T4 may be turned on in response to a carry signal CR having the low level L, a second transistor T2 may be turned on in response to the enable signal EN having the low level L, and a third transistor T3 may be turned off in response to the inverted enable signal ENB having the high level H, for example. Thus, the first and second transistors T1 and T2 may apply a high gate voltage VGH to the enable node EN_NODE, and the voltage of the enable node EN_NODE may have the high level H.

In a fourth time period TP4 after the third time period TP3, the control circuit 210 may control a voltage of a second node QB to the low level L in response to a second clock signal CLK2 having the low level L. A carry output circuit 220 may output the carry signal CR having the high level H in response to the voltage of the second node QB having the low level L.

Further, in the fourth time period TP4, the enable node controlling circuit 230 may hold the voltage of the enable node EN_NODE as the high level H. In an embodiment, as illustrated in FIG. 10, the first and fourth transistors T1 and T4 may be turned off in response to the carry signal CR having the high level H, the second transistor T2 may be turned on in response to the enable signal EN having the low level L, and the third transistor T3 may be turned off in response to the inverted enable signal ENB having the high level H, for example. Thus, the high gate voltage VGH and a low gate voltage VGL may not be applied to the enable node EN_NODE, and a first capacitor C1 may hold the voltage of the enable node EN_NODE to a previous level, or the high level H.

Further, in the fourth time period TP4, a masking circuit 240 may control a voltage of a third node MQB to the high level H by separating the second node QB from the third node MQB in response to the voltage of the enable node EN_NODE having the high level H, and a scan output circuit 250 may not output a scan signal SS having the high level H in response to the voltage of the third node MQB having the high level H. In an embodiment, as illustrated in FIG. 11, a fifth transistor T5 may separate the second node QB from the third node MQB in response to the voltage of the enable node EN_NODE having the high level H, and thus the voltage of the third node MQB may be held or maintained as a previous level, or the high level H, for example. Further, a sixth transistor T6 may be turned off in response to the carry signal CR having the high level H, and a seventh transistor T7 may be turned on in response to the enable signal EN having the low level L. In addition, a tenth transistor T10 may be turned off in response to the voltage of the third node MQB having the high level H, and an eleventh transistor T11 may be turned off in response to the voltage of the first node Q having the high level H. Thus, a voltage of a scan output node SON may be held or maintained as a previous level, or the low level L, and the scan signal SS having the high level H may not be output at the scan output node SON.

As described above, in a case where the enable signal EN has the low level L at a time point at which outputting the carry signal CR having the high level H is initiated, or at an end time point of the third period TP3 or a start time point of the fourth period TP4, a stage 200 may not output the scan signal SS having the high level H.

Figure 12:
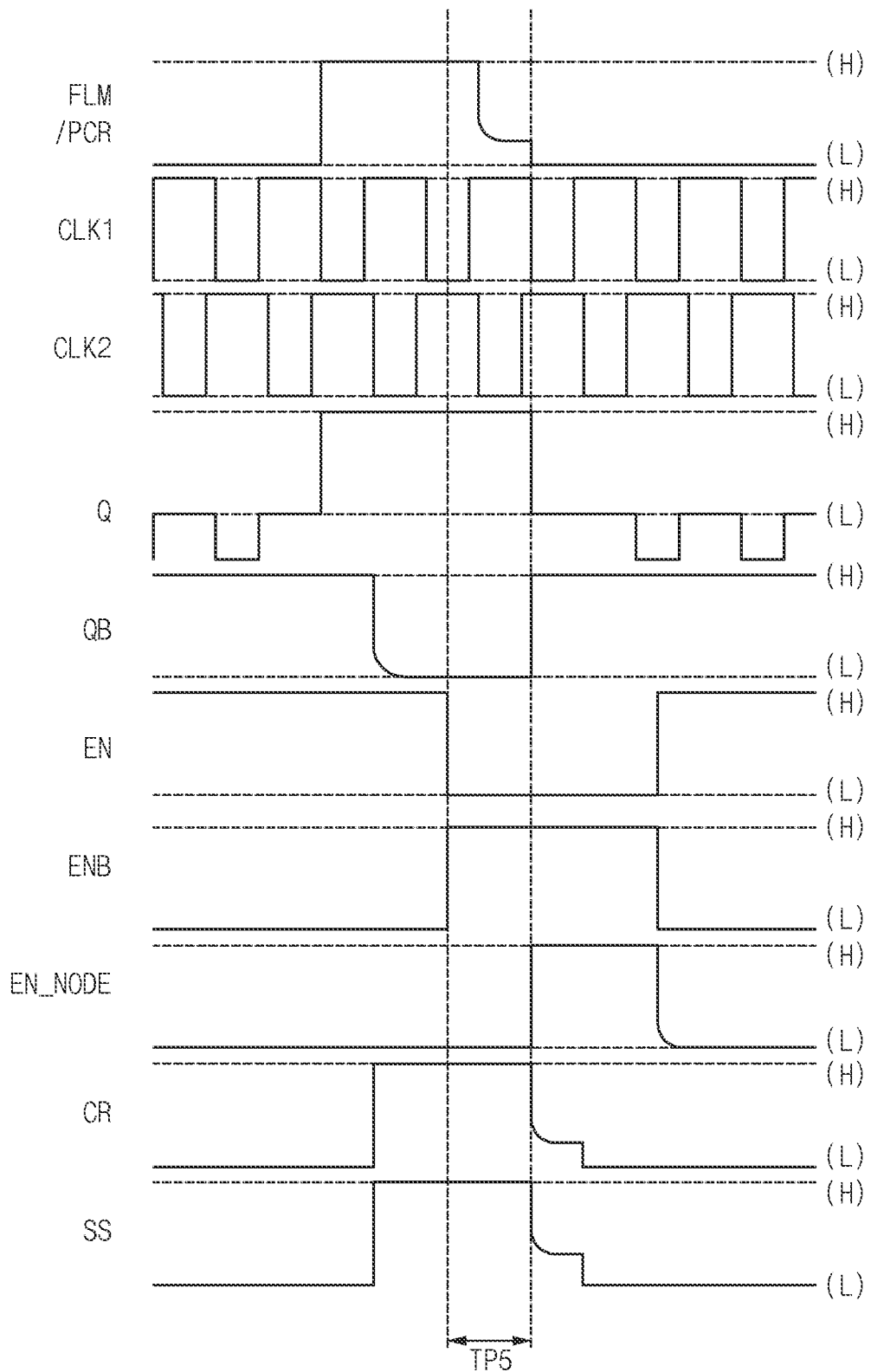
FIG. 12 is a timing diagram for describing an embodiment of an operation of a stage of FIG. 3 when an enable signal is changed from a first level to a second level while a carry signal is output.
Figure 13:
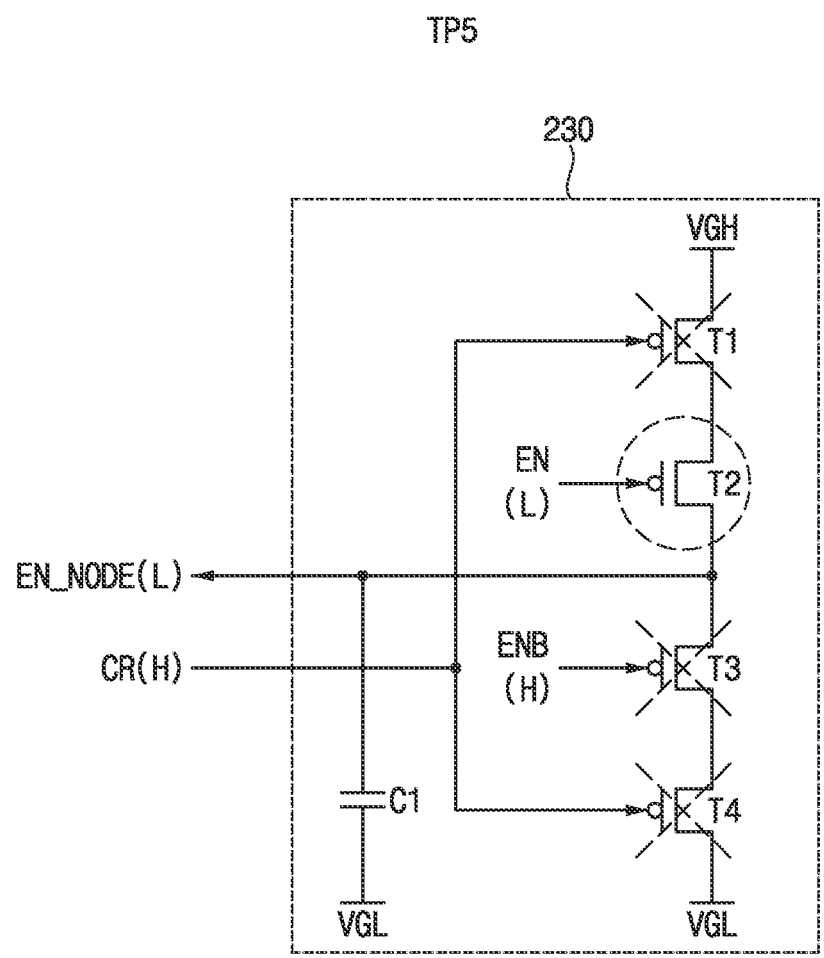
FIG. 13 is a circuit diagram for describing an operation of an enable node controlling circuit in a fifth time period.
Figure 14:
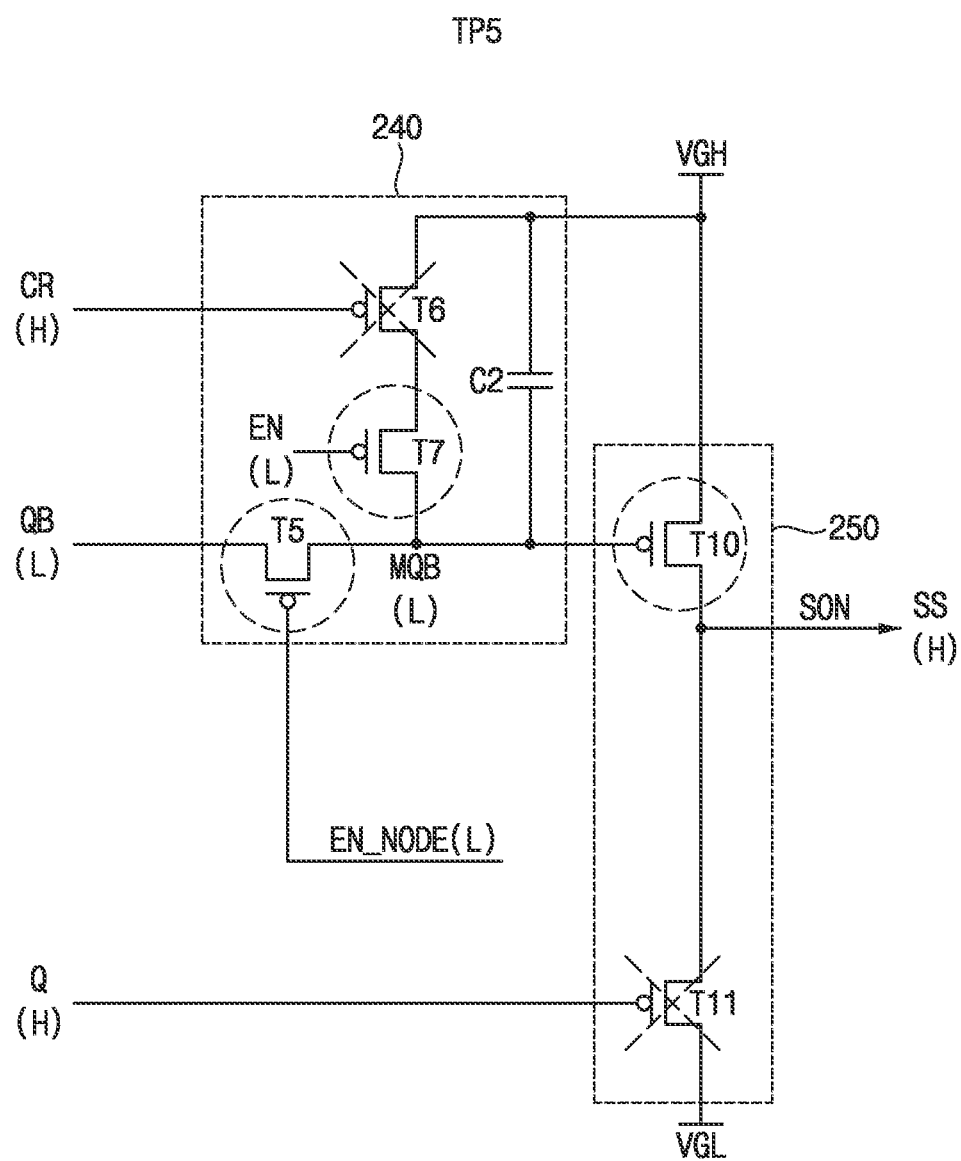
FIG. 14 is a circuit diagram for describing operations of a masking circuit and a scan output circuit in a fifth time period.

FIG. 12 is a timing diagram for describing an embodiment of an operation of a stage of FIG. 3 when an enable signal is changed from a first level to a second level while a carry signal is output, FIG. 13 is a circuit diagram for describing an operation of an enable node controlling circuit in a fifth time period, and FIG. 14 is a circuit diagram for describing operations of a masking circuit and a scan output circuit in a fifth time period.

A timing diagram of FIG. 12 may be similar to a timing diagram of FIG. 4, except that, while a carry signal CR having a high level H is output, an enable signal EN is changed from the high level H to a low level L, and an inverted enable signal ENB is changed from the low level L to the high level H.

Referring to FIGS. 3 and 12, in a fifth time period TP5 in which the carry signal CR having the high level H is output, the enable signal EN has the low level L, and the inverted enable signal ENB has the high level H, an enable node controlling circuit 230 may hold a voltage of an enable node EN_NODE as the low level L. In an embodiment, as illustrated in FIG. 13, first and fourth transistors T1 and T4 may be turned off in response to the carry signal CR having the high level H, a second transistor T2 may be turned on in response to the enable signal EN having the low level L, and a third transistor T3 may be turned off in response to the inverted enable signal ENB having the high level H, for example. That is, even when the second transistor T2 is turned on by the enable signal EN changed from the high level H to the low level L, since the first and fourth transistors T1 and T4 are turned off, a high gate voltage VGH and a low gate voltage VGL may not be applied to the enable node EN_NODE, and a first capacitor C1 may hold the voltage of the enable node EN_NODE to a previous level, or the low level L.

Further, in the fifth time period TP5, a masking circuit 240 may control a voltage of a third node MQB to the low level L by coupling a second node QB to the third node MQB in response to the voltage of the enable node EN_NODE having the low level L, and a scan output circuit 250 may output a scan signal SS having the high level H in response to the voltage of the third node MQB having the low level L. In an embodiment, as illustrated in FIG. 14, a fifth transistor T5 may couple the second node QB to the third node MQB in response to the voltage of the enable node EN_NODE having the low level L, and thus the voltage of the third node MQB may have the level of the voltage of the second node QB, or the low level L, for example. Further, a sixth transistor T6 may be turned off in response to the carry signal CR having the high level H, and a seventh transistor T7 may be turned on in response to the enable signal EN having the low level L. In addition, a tenth transistor T10 may be turned on in response to the voltage of the third node MQB having the low level L, and an eleventh transistor T11 may be turned off in response to a voltage of a first node Q having the high level H. The tenth transistor T10 may apply the high gate voltage VGH to a scan output node SON, and thus the scan signal SS having the high level H may be output at the scan output node SON.

As described above, even when the enable signal EN is changed from the high level H to the low level L while the carry signal CR having the high level H is output, a stage 200 may continue outputting the scan signal SS having the high level H.

Figure 15:
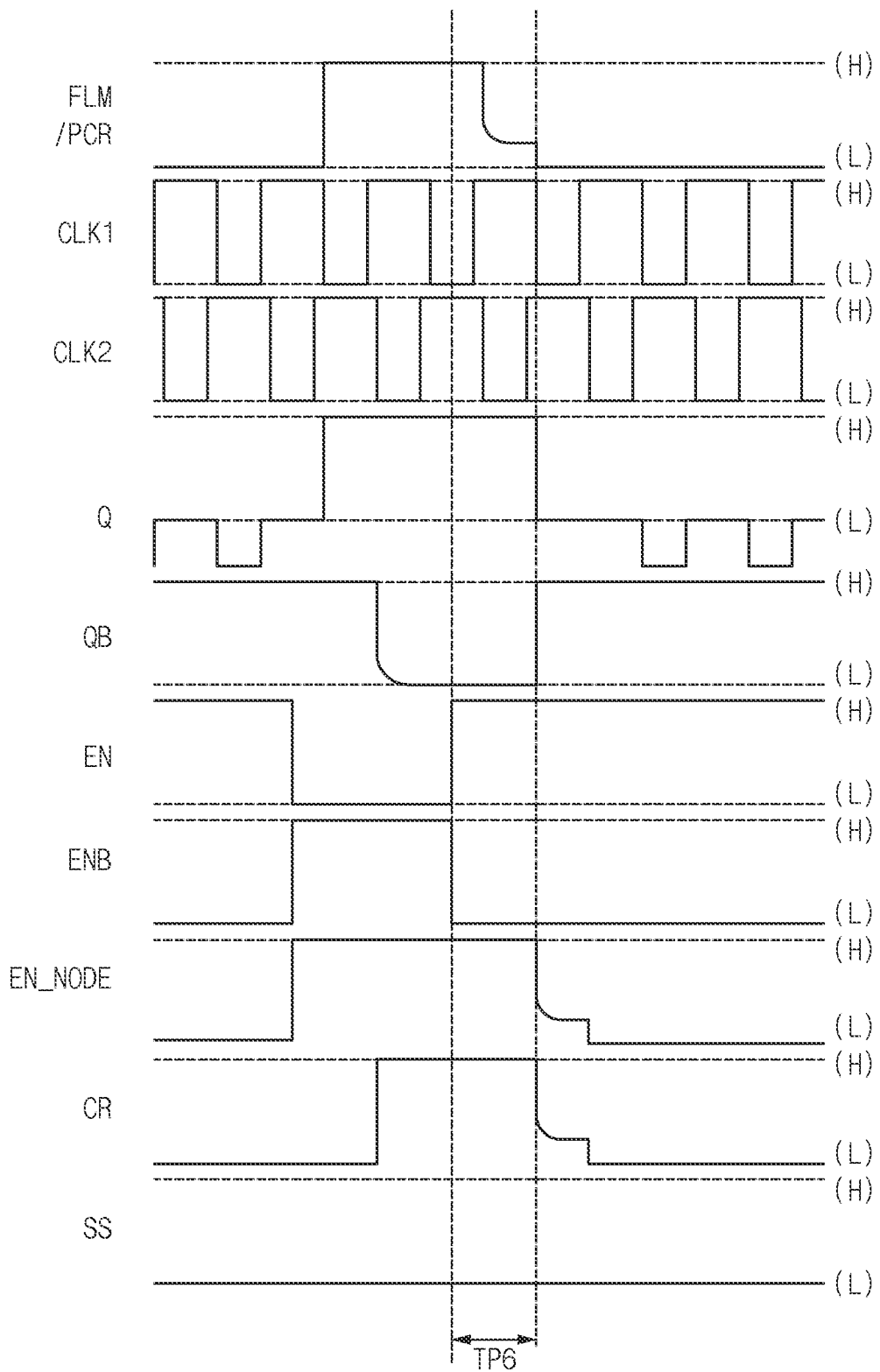
FIG. 15 is a timing diagram for describing an embodiment of an operation of a stage of FIG. 3 when an enable signal is changed from a second level to a first level while a carry signal is output.
Figure 16:
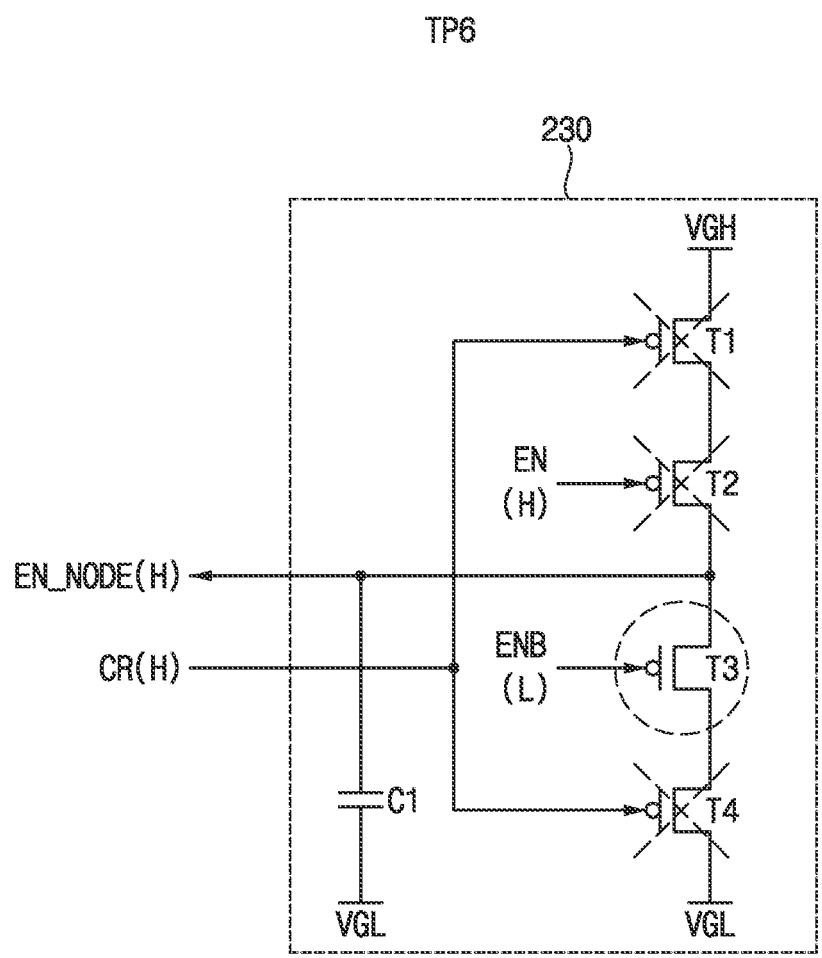
FIG. 16 is a circuit diagram for describing an operation of an enable node controlling circuit in a sixth time period.
Figure 17:
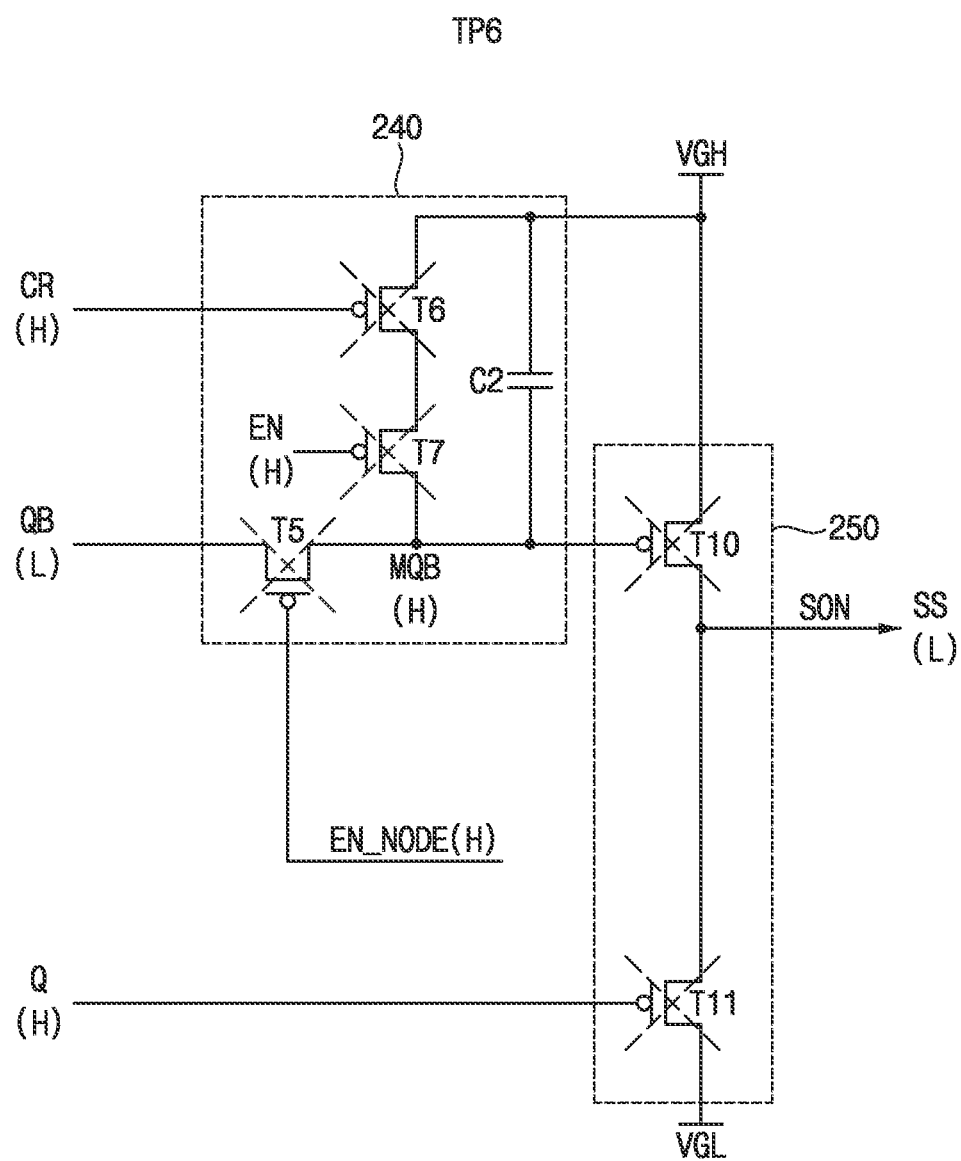
FIG. 17 is a circuit diagram for describing operations of a masking circuit and a scan output circuit in a sixth time period.

FIG. 15 is a timing diagram for describing an embodiment of an operation of a stage of FIG. 3 when an enable signal is changed from a second level to a first level while a carry signal is output, FIG. 16 is a circuit diagram for describing an operation of an enable node controlling circuit in a sixth time period, and FIG. 17 is a circuit diagram for describing operations of a masking circuit and an output circuit in a sixth time period.

A timing diagram of FIG. 15 may be similar to a timing diagram of FIG. 8, except that, while a carry signal CR having a high level H is output, an enable signal EN is changed from a low level L to the high level H, and an inverted enable signal ENB is changed from the high level H to the low level L.

Referring to FIGS. 3 and 15, in a sixth time period TP6 in which the carry signal CR having the high level H is output, the enable signal EN has the high level H, and the inverted enable signal ENB has the low level L, an enable node controlling circuit 230 may hold a voltage of an enable node EN_NODE as the hold level H. In an embodiment, as illustrated in FIG. 16, first and fourth transistors T1 and T4 may be turned off in response to the carry signal CR having the high level H, a second transistor T2 may be turned off in response to the enable signal EN having the high level H, and a third transistor T3 may be turned on in response to the inverted enable signal ENB having the low level L, for example. That is, even when the third transistor T3 is turned on by the inverted enable signal ENB changed from the high level H to the low level L, since the first and fourth transistors T1 and T4 are turned off, a high gate voltage VGH and a low gate voltage VGL may not be applied to the enable node EN_NODE, and a first capacitor C1 may hold the voltage of the enable node EN_NODE to a previous level, or the high level H.

Further, in the sixth time period TP6, a masking circuit 240 may control a voltage of a third node MQB to the high level H by separating a second node QB from the third node MQB in response to the voltage of the enable node EN_NODE having the high level H, and a scan output circuit 250 may not output a scan signal SS having the high level H in response to the voltage of the third node MQB having the high level H. In an embodiment, as illustrated in FIG. 17, a fifth transistor T5 may separate the second node QB from the third node MQB in response to the voltage of the enable node EN_NODE having the high level H, and thus the voltage of the third node MQB may be held or maintained as a previous level, or the high level H, for example. Further, a sixth transistor T6 may be turned off in response to the carry signal CR having the high level H, and a seventh transistor T7 may be turned off in response to the enable signal EN having the high level H. In addition, a tenth transistor T10 may be turned off in response to the voltage of the third node MQB having the high level H, and an eleventh transistor T11 may be turned off in response to a voltage of a first node Q having the high level H. Thus, a voltage of a scan output node SON may be held or maintained as a previous level, or the low level L, and the scan signal SS having the high level H may not be output at the scan output node SON.

As described above, even when the enable signal EN is changed from the low level L to the high level H while the carry signal CR having the high level H is output, a stage 200 may not output the scan signal SS having the high level H.

Figure 18:
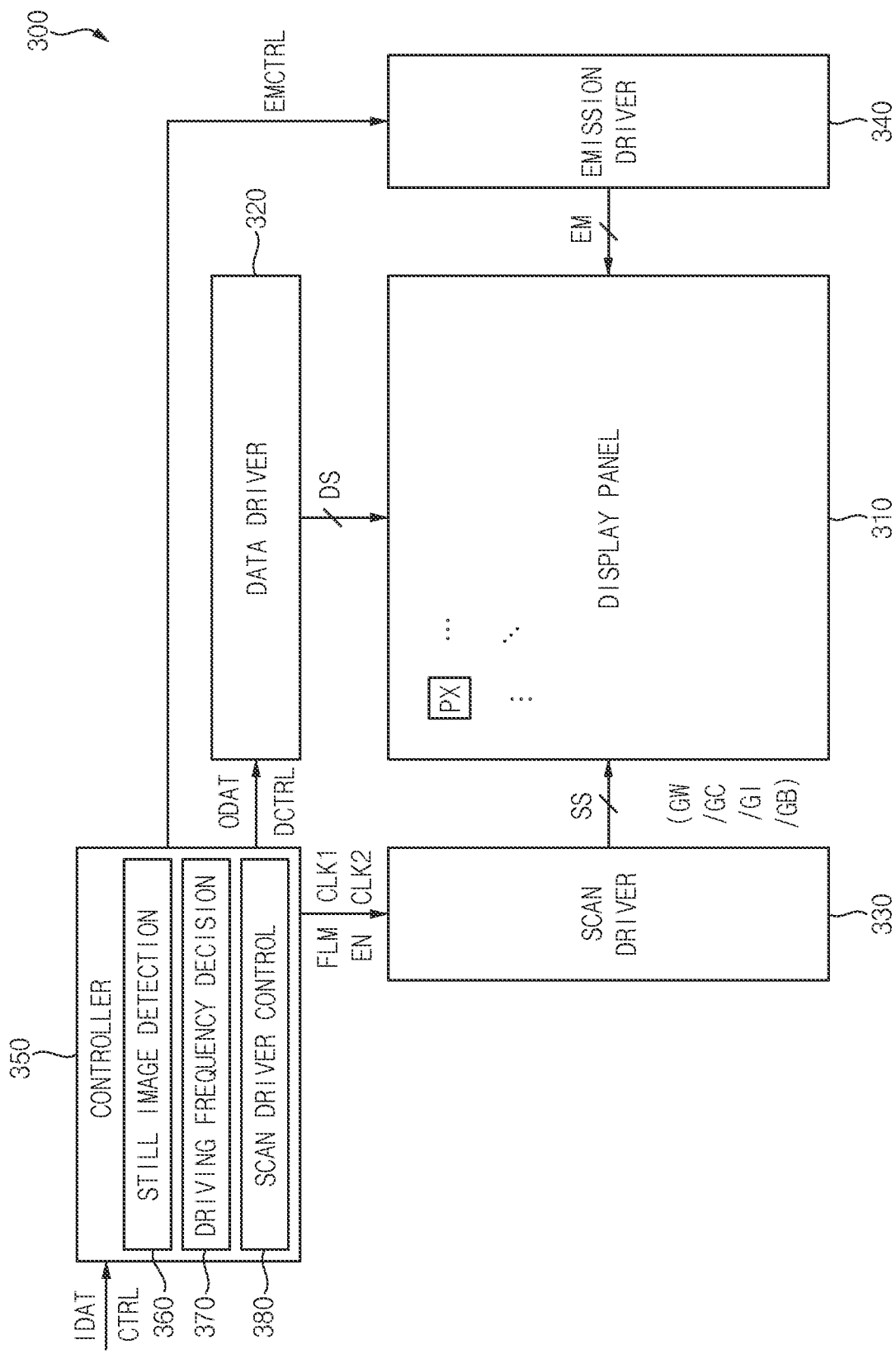
FIG. 18 is a block diagram illustrating an embodiment of a display device including a scan driver.
Figure 19:
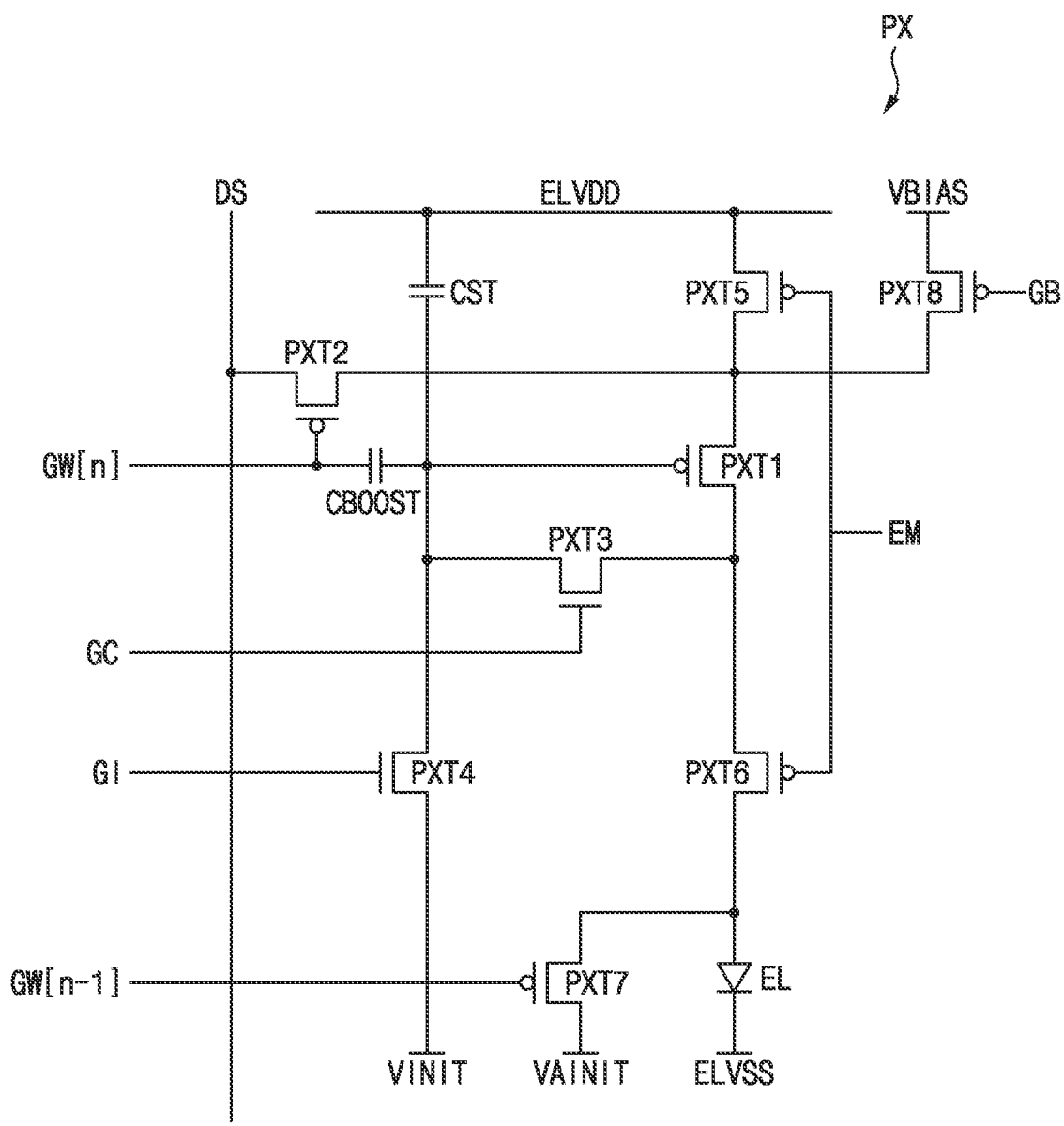
FIG. 19 is a circuit diagram illustrating an embodiment of a pixel included in a display device.

FIG. 18 is a block diagram illustrating an embodiment of a display device including a scan driver, and FIG. 19 is a circuit diagram illustrating an embodiment of a pixel included in a display device.

Referring to FIG. 18, a display device 300 in embodiments may include a display panel 310 that includes a plurality of pixels PX, a data driver 320 that provides data signals DS to the plurality of pixels PX, a scan driver 330 that provides scan signals SS to the plurality of pixels PX, and a controller 350 that controls the data driver 320 and the scan driver 330. In some embodiments, the display device 300 may further include an emission driver 340 that provides emission signals EM to the plurality of pixels PX.

The display panel 310 may include a plurality of scan lines, a plurality of data lines, and the plurality of pixels PX coupled thereto. In some embodiments, each pixel PX may include a light-emitting element, and the display panel 310 may a light-emitting display panel. However, the display panel 310 is not limited to the light-emitting display panel, and may be any suitable display panel.

In an embodiment, as illustrated in FIG. 19, each pixel PX may include a driving transistor PXT1 that generates a driving current, a switching transistor PXT2 that transfers the data signal DS to a source of the driving transistor PXT1 in response to a writing signal GW[n], a compensating transistor PXT3 that diode-connects the driving transistor PXT1 in response to a compensation signal GC, a storage capacitor CST that stores the data signal DS transferred through the switching transistor PXT2 and the diode-connected driving transistor PXT1, a gate initializing transistor PXT4 that provides an initialization voltage VINIT to the storage capacitor CST and a gate of the driving transistor PXT1 in response to an initialization signal GI, a first emission transistor PXT5 that connects a line of a first power supply voltage ELVDD to the source of the driving transistor PXT1 in response to the emission signal EM, a second emission transistor PXT6 that connects a drain of the driving transistor PXT1 to a light-emitting element EL in response to the emission signal EM, an anode initializing transistor PXT7 that provides an anode initialization voltage VAINIT to the light-emitting element EL in response to a previous writing signal GW[n−1], and the light-emitting element EL that emits light based on the driving current from the line of the first power supply voltage ELVDD to a line of a second power supply voltage ELVSS, for example. In some embodiments, each pixel PX may further include a boost capacitor CBOOST coupled between a line of the writing signal GW[n] and the gate of the driving transistor PXT1, and a bias transistor T8 that applies a bias voltage VBIAS to the source of the driving transistor PXT1 in response to a bias signal GB (or a bypass signal).

In some embodiments, at least a portion of the transistors PXT1 through PXT8 of the pixel PX may be implemented with NMOS transistors, and the remaining portion of the transistors PXT1 through PXT8 of the pixel PX may be implemented with PMOS transistors. In an embodiment, as illustrated in FIG. 19, the compensating transistor PXT3 and the gate initializing transistor PXT4 may be implemented with the NMOS transistors, and the remaining transistors PXT1, PXT2 and PXT5 through PXT8 may be implemented with the PMOS transistors, for example. In other embodiments, all of the transistors PXT1 through PXT8 of each pixel PX may be implemented with the NMOS transistors, or may be implemented with the PMOS transistors.

Further, in some embodiments, the light-emitting element EL may be, but not be limited to, an organic light-emitting diode ("OLED"). In an embodiment, the light-emitting element EL may be a nano light-emitting diode ("NED"), a quantum dot ("QD") light-emitting diode, a micro light-emitting diode, an inorganic light-emitting diode, or any other suitable light-emitting element, for example.

Although FIG. 19 illustrates an embodiment where each pixel PX has an 8T2C structure including eight transistors PXT1 through PXT8 and two capacitors CST and CBOOST, each pixel PX of the display device 300 in embodiments is not limited to the 8T2C structure illustrated in FIG. 18, and may have any pixel structure.

The data driver 320 may generate the data signals DS based on output image data ODAT and a data control signal DCTRL received from the controller 350, and may provide the data signals DS to the plurality of pixels PX through the plurality of data lines. In some embodiments, the data control signal DCTRL may include, but not limited to, an output data enable signal, a horizontal start signal and a load signal. In some embodiments, the data driver 320 and the controller 350 may be implemented with a single integrated circuit ("IC"), and the single IC may be also referred to as a timing controller embedded data driver ("TED"). In other embodiments, the data driver 320 and the controller 350 may be implemented with separate ICs.

The scan driver 330 may generate the scan signals SS based on a scan control signal received from the controller 350, and may provide the scan signals SS to the plurality of pixels PX through the plurality of scan lines. In some embodiments, the scan control signal may include, but not limited to, a scan start signal FLM, a first clock signals CLKT, a second clock signal CLK2 and an enable signal EN. Further, in some embodiments, the scan signal SS may include the writing signal GW[n], the compensation signal GC, the initialization signal GI and the bias signal GB. In some embodiments, as least one of the compensation signal GC and the initialization signal GI applied to the compensating transistor PXT3 and the gate initializing transistor PXT4 implemented with the NMOS transistors may be generated and output by a stages 200 illustrated in FIG. 3. Further, in some embodiments, the scan driver 330 may be integrated or formed in a peripheral portion of the display panel 310. In other embodiments, the scan driver 330 may be implemented with one or more ICs.

The emission driver 340 may generate the emission signals EM based on an emission control signal EMCTRL received from the controller 350, and may provide the emission signals EM to the plurality of pixels PX through a plurality of emission lines. In some embodiments, the emission signals EM may be sequentially provided on a row basis. In other embodiments, the emission signals EM may be a global signal that is substantially simultaneously provided to the plurality of pixels PX. In some embodiment, the emission driver 340 may be integrated or formed on the peripheral portion of the display panel 310. In other embodiments, the emission driver 340 may be implemented with one or more ICs.

The controller 350 (e.g., a timing controller ("TCON")) may receive input image data IDAT and a control signal CTRL from an external host processor (e.g., a graphics processing unit ("GPU") or a graphics card). In some embodiments, the control signal CTRL may include, but not limited to, a vertical synchronization signal, a horizontal synchronization signal, an input data enable signal, a master clock signal, etc. The controller 350 may generate the output image data ODAT, the data control signal DCTRL, the scan control signal and the emission control signal EMCTRL based on the input image data IDAT and the control signal CTRL. The controller 350 may control an operation of the data driver 320 by providing the output image data ODAT and the data control signal DCTRL to the data driver 320, may control an operation of the scan driver 330 by providing the scan control signal to the scan driver 330, and may control an operation of the emission driver 340 by providing the emission control signal EMCTRL to the emission driver 340.

The display device 300 in embodiments may perform multi-frequency driving ("MFD") that drives a plurality of panel regions of the display panel 310 at a plurality of driving frequencies (that may be different from each other). To perform this MFD, as illustrated in FIG. 18, the controller 350 may include a still image detection block 360, a driving frequency decision block 370 and a scan driver control block 380.

The still image detection block 360 may divide the input image data IDAT into a plurality of panel region data for a plurality of panel regions each including at least one pixel row, and may determine whether each of the plurality of panel region data represents a still image.

The driving frequency decision block 370 may decide a plurality of driving frequencies for the plurality of panel regions according to whether each of the plurality of panel region data represents the still image. In some embodiments, in a case where each panel region data represents a moving image, the driving frequency decision block 370 may decide the driving frequency for the panel region corresponding to the panel region data as a normal driving frequency. Here, the normal driving frequency may be a driving frequency in normal driving of the display device 300. In an embodiment, the normal driving frequency may be the same as an input frame frequency (e.g., about 60 hertz (Hz) or about 120 Hz) of the input image data IDAT, for example. Further, in a case where each panel region data represents the still image, the driving frequency decision block 370 may decide the driving frequency for the panel region corresponding to the panel region data as a low driving frequency lower than the normal driving frequency. Here, the low driving frequency may be any frequency lower than the normal driving frequency.

The scan driver control block 380 may generate the enable signal EN based on the plurality of driving frequencies for the plurality of panel regions. In some embodiments, the scan driver control block 380 may control the enable signal EN to have a first level (e.g., a high level) when the scan signal SS is to be output, and may control the enable signal EN to have a second level (e.g., a low level) when the scan signal SS is not to be output. Accordingly, with respect to each panel region driven at the normal driving frequency, the scan signal SS may be provided in each of a plurality of frame periods. However, with respect to each panel region driven at the low driving frequency, the scan signal SS may not be provided in at least one of the plurality of frame periods.

Figure 20:
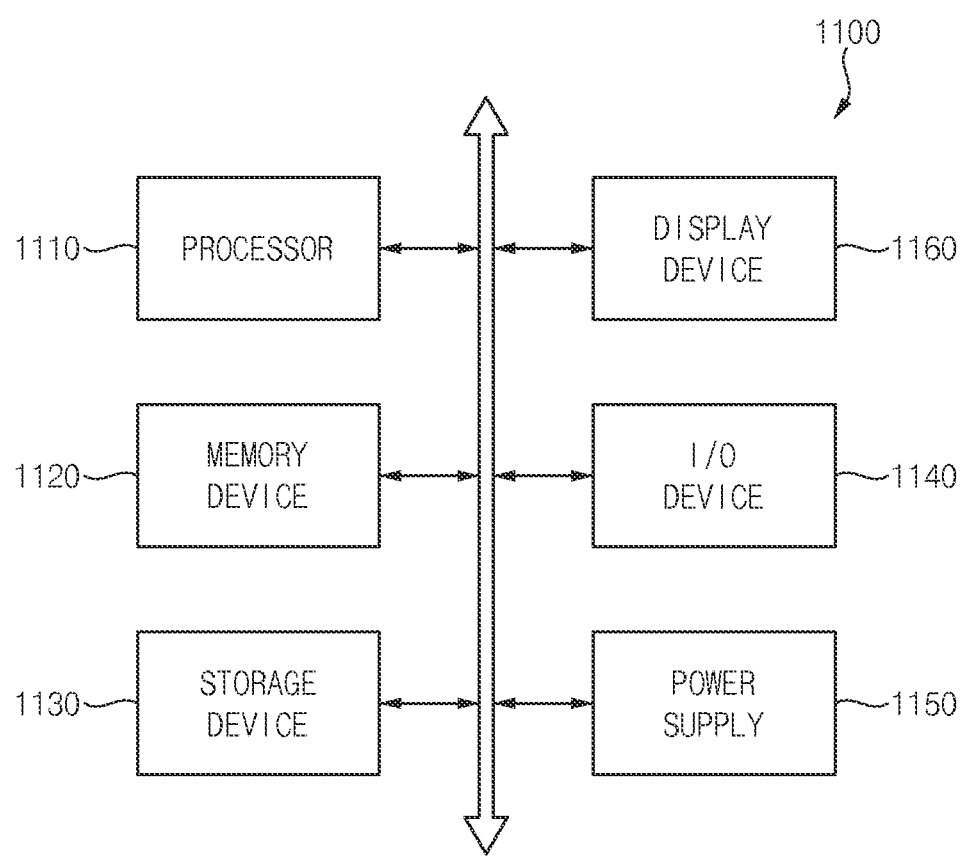
FIG. 20 is a block diagram illustrating an embodiment of an electronic device including a display device.

FIG. 20 is a block diagram illustrating an embodiment of an electronic device including a display device.

Referring to FIG. 20, an electronic device 1100 may include a processor 1110, a memory device 1120, a storage device 1130, an input/output ("I/O") device 1140, a power supply 1150, and a display device 1160. The electronic device 1100 may further include a plurality of ports for communicating with a video card, a sound card, a memory card, a universal serial bus ("USB") device, other electric devices, etc.

The processor 1110 may perform various computing functions or tasks. The processor 1110 may be an application processor ("AP"), a microprocessor, a central processing unit ("CPU"), etc. The processor 1110 may be coupled to other components via an address bus, a control bus, a data bus, etc. Further, in some embodiments, the processor 1110 may be further coupled to an extended bus such as a peripheral component interconnection ("PCI") bus.

The memory device 1120 may store data for operations of the electronic device 1100. In an embodiment, the memory device 1120 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile dynamic random access memory ("mobile DRAM") device, etc., for example.

The storage device 1130 may be a solid state drive ("SSD") device, a hard disk drive ("HDD") device, a compact disc read-only memory ("CD-ROM") device, etc. The I/O device 1140 may be an input device such as a keyboard, a keypad, a mouse, a touch screen, etc., and an output device such as a printer, a speaker, etc. The power supply 1150 may supply power for operations of the electronic device 1100. The display device 1160 may be coupled to other components through the buses or other communication links.

In the display device 1160, each stage of a scan driver may include an enable node controlling circuit that controls a voltage of an enable node according to an enable signal, and holds the voltage of the enable node while a carry signal is output, and a masking circuit that selectively couples a second node and a third node in response to the voltage of the enable node.

Accordingly, each of scan signals generated by the scan driver may have a time length corresponding to two or more horizontal times, and the scan signals may be provided at different driving frequencies to respective regions of a display panel.

The inventive concepts may be applied to any display device 1160 and any electronic device 1100 including the display device 1160. In an embodiment, the inventive concepts may be applied to a smart phone, a wearable electronic device, a tablet computer, a mobile phone, a television ("TV"), a digital TV, a three dimensional ("3D") TV, a personal computer ("PC"), a home appliance, a laptop computer, a personal digital assistant ("PDA"), a portable multimedia player ("PMP"), a digital camera, a music player, a portable game console, a navigation device, etc.

Figure 21:
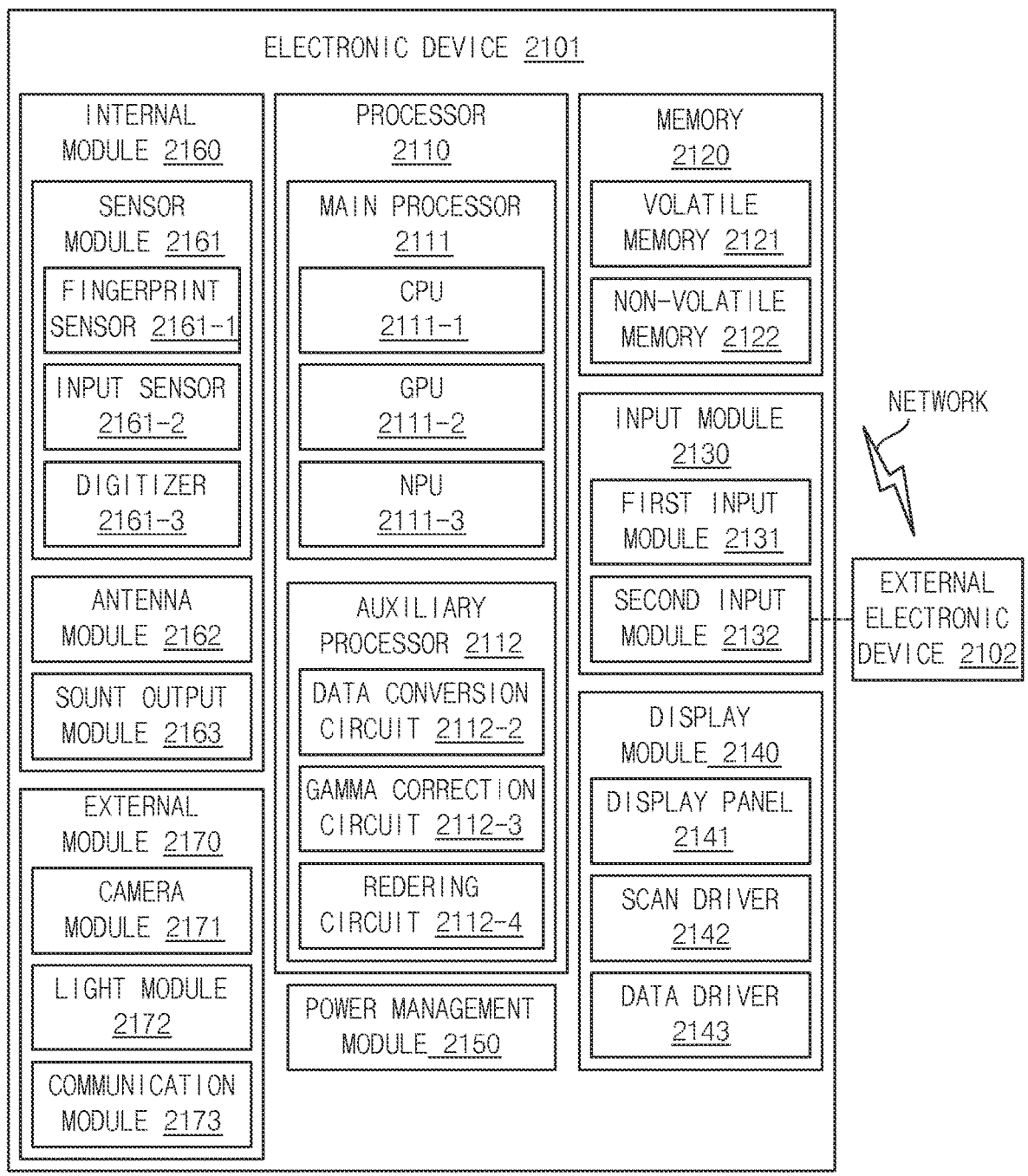
FIG. 21 is a block diagram illustrating an embodiment of an electronic device.

FIG. 21 is a block diagram illustrating an embodiment of an electronic device.

An electronic device 2101 may output various information via a display module 2140 in an operating system. When a processor 2110 executes an application stored in a memory 2120, the display module 2140 may provide application information to a user via a display panel 2141.

The processor 2110 may obtain an external input via an input module 2130 or a sensor module 2161 and may execute an application corresponding to the external input. In an embodiment, when the user selects a camera icon displayed on the display panel 2141, the processor 2110 may obtain a user input via an input sensor 2161-2 and may activate a camera module 2171, for example. The processor 2110 may transfer image data corresponding to an image captured by the camera module 2171 to the display module 2140. The display module 2140 may display an image corresponding to the captured image via the display panel 2141.

In another embodiment, when personal information authentication is executed in the display module 2140, a fingerprint sensor 2161-1 may obtain input fingerprint information as input data. The processor 2110 may compare the input data obtained by the fingerprint sensor 2161-1 with authentication data stored in the memory 2120, and may execute an application according to the comparison result. The display module 2140 may display information executed according to application logic via the display panel 2141.

As still another example, when a music streaming icon displayed on the display module 2140 is selected, the processor 2110 obtains a user input via the input sensor 2161-2 and may activate a music streaming application stored in the memory 2120. When a music execution command is input in the music streaming application, the processor 2110 may activate a sound output module 2163 to provide sound information corresponding to the music execution command to the user.

In the above, an operation of the electronic device 2101 has been briefly described. Hereinafter, a configuration of the electronic device 2101 will be described in detail. Some of components of the electronic device 2101 described below may be integrated and provided as one component, or one component may be provided separately as two or more components.

Referring to FIG. 21, an electronic device 2101 may communicate with an external electronic device 2102 via a network (e.g., a short-range wireless communication network or a long-range wireless communication network). In some embodiments, the electronic device 2101 may include a processor 2110, a memory 2120, an input module 2130, a display module 2140, a power management module 2150, an internal module 2160 and an external module 2170. In some embodiments, at least one of the components may be omitted from the electronic device 2101, or one or more other components may be added in the electronic device 2101. In some embodiments, some of the components (e.g., the sensor module 2161, an antenna module 2162, or the sound output module 2163) may be implemented as a single component (e.g., the display module 2140).

The processor 2110 may execute software to control at least one other component (e.g., a hardware or software component) of the electronic device 2101 coupled with the processor 2110, and may perform various data processing or computation. In some embodiments, as at least part of the data processing or computation, the processor 2110 may store a command or data received from another component (e.g., the input module 2130, the sensor module 2161 or a communication module 2173) in a volatile memory 2121, may process the command or the data stored in the volatile memory 2121, and may store resulting data in a non-volatile memory 2122.

The processor 2110 may include a main processor 2111 and an auxiliary processor 2112. The main processor 2111 may include one or more of a central processing unit ("CPU") 2111-1 or an application processor ("AP"). The main processor 2111 may further include any one or more of a graphics processing unit ("GPU") 2111-2, a communication processor ("CP"), and an image signal processor ("ISP"). The main processor 2111 may further include a neural processing unit ("NPU") 2111-3. The NPU 2111-3 may be a processor specialized in processing an artificial intelligence model, and the artificial intelligence model may be generated through machine learning. The artificial intelligence model may include a plurality of artificial neural network layers. The artificial neural network may be a deep neural network ("DNN"), a convolutional neural network ("CNN"), a recurrent neural network ("RNN"), a restricted Boltzmann machine ("RBM"), a deep belief network ("DBN"), a bidirectional recurrent deep neural network ("BRDNN"), deep Q-network or a combination of two or more thereof, but is not limited thereto. The artificial intelligence model may, additionally or alternatively, include a software structure other than a hardware structure. At least two of the above-described processing units and processors may be implemented as an integrated component (e.g., a single chip), or respective processing units and processors may be implemented as independent components (e.g., a plurality of chips).

The auxiliary processor 2112 may include a controller. The controller may include an interface conversion circuit and a timing control circuit. The controller may receive an image signal from the main processor 2111, may convert a data format of the image signal to meet interface specifications with the display module 2140, and may output image data. The controller may output various control signals desired for driving the display module 2140.

The auxiliary processor 2112 may further include a data conversion circuit 2112-2, a gamma correction circuit 2112-3, a rendering circuit 2112-4, or the like. The data conversion circuit 2112-2 may receive image data from the controller. The data conversion circuit 2112-2 may compensate for the image data such that an image is displayed with a desired luminance according to characteristics of the electronic device 2101 or the user's setting, or may convert the image data to reduce power consumption or to eliminate an afterimage. The gamma correction circuit 2112-3 may convert image data or a gamma reference voltage so that an image displayed on the electronic device 2101 has desired gamma characteristics. The rendering circuit 2112-4 may receive image data from the controller, and may render the image data in consideration of a pixel arrangement of the display panel 2141 in the electronic device 2101. At least one of the data conversion circuit 2112-2, the gamma correction circuit 2112-3 and the rendering circuit 2112-4 may be integrated in another component (e.g., the main processor 2111 or the controller). At least one of the data conversion circuit 2112-2, the gamma correction circuit 2112-3 and the rendering circuit 2112-4 may be integrated in a data driver 2143 described below.

The memory 2120 may store various data used by at least one component (e.g., the processor 2110 or the sensor module 2161) of the electronic device 2101. The various data may include input data or output data for a command related thereto, for example. The memory 2120 may include at least one of the volatile memory 2121 and the non-volatile memory 2122.

The input module 2130 may receive a command or data to be used by the components (e.g., the processor 2110, the sensor module 2161, or the sound output module 2163) of the electronic device 2101 from the outside of the electronic device 2101 (e.g., the user or the external electronic device 2102).

The input module 2130 may include a first input module 2131 for receiving a command or data from the user, and a second input module 2132 for receiving a command or data from the external electronic device 2102. The first input module 2131 may include a microphone, a mouse, a keyboard, a key (e.g., a button) or a pen (e.g., a passive pen or an active pen). The second input module 2132 may support a designated protocol capable of connecting the electronic device 2101 to the external electronic device 2102 by wire or wirelessly. In some embodiments, the second input module 2132 may include a high definition multimedia interface ("HDMI"), a universal serial bus ("USB") interface, a secure digital ("SD") card interface or an audio interface. The second input module 2132 may include a connector that may physically connect the electronic device 2101 to the external electronic device 2102. In an embodiment, the second input module 2132 may include an HDMI connector, a USB connector, an SD card connector or an audio connector (e.g., a headphone connector), for example.

The display module 2140 may visually provide information to the user. The display module 2140 may include the display panel 2141, a scan driver 2142 and a data driver 2143. The display module 2140 may further include a window, a chassis and a bracket for protecting the display panel 2141.

The display panel 2141 may include a liquid crystal display panel, an organic light-emitting display panel or an inorganic light-emitting display panel, but the type of the display panel 2141 is limited thereto. The display panel 2141 may be a rigid type display panel, or a flexible type display panel capable of being rolled or folded. The display module 2140 may further include a supporter, a bracket or a heat dissipation member that supports the display panel 2141.

The scan driver 2142 may be disposed (e.g., mounted) on the display panel 2141 as a driving chip. In an alternative embodiment, the scan driver 2142 may be integrated into the display panel 2141. In an embodiment, the scan driver 2142 may include an amorphous silicon TFT gate driver circuit ("ASG"), a low temperature polycrystalline silicon ("LTPS") TFT gate driver circuit or an oxide semiconductor TFT gate driver circuit ("OSG") embedded in the display panel 2141, for example. The scan driver 2142 may receive a control signal from the controller and may output scan signals to the display panel 2141 in response to the control signal.

The display panel 2141 may further include an emission driver. The emission driver may output an emission signal to the display panel 2141 in response to a control signal received from the controller. The emission driver may be formed separately from the scan driver 2142, or may be integrated into the scan driver 2142.

The data driver 2143 may receive a control signal from the controller, may convert image data into analog voltages (e.g., data voltages) in response to the control signal, and then may output the data voltages to the display panel 2141.

The data driver 2143 may be incorporated into other components (e.g., the controller). Further, the functions of the interface conversion circuit and the timing control circuit of the controller described above may be integrated into the data driver 2143.

The display module 2140 may further include the emission driver, a voltage generator circuit, or the like. The voltage generator circuit may output various voltages desired for driving the display panel 2141.

The power management module 2150 may supply power to the components of the electronic device 2101. The power management module 2150 may include a battery that charges a power supply voltage. The battery may include a primary cell which is not rechargeable, a secondary cell which is rechargeable, or a fuel cell. The power management module 2150 may include a power management integrated circuit ("PMIC"). The PMIC may supply optimal power to each of the modules described above and modules described below. The power management module 2150 may include a wireless power transmission/reception member electrically connected to the battery. The wireless power transmission/reception member may include a plurality of antenna radiators in the form of coils.

The electronic device 2101 may further include the internal module 2160 and the external module 2170. The internal module 2160 may include the sensor module 2161, the antenna module 2162 and the sound output module 2163. The external module 2170 may include the camera module 2171, a light module 2172 and the communication module 2173.

The sensor module 2161 may detect an input by the user's body or an input by the pen of the first input module 2131, and may generate an electrical signal or data value corresponding to the input. The sensor module 2161 may include at least one of the fingerprint sensor 2161-1, the input sensor 2161-2 and a digitizer 2161-3.

The fingerprint sensor 2161-1 may generate a data value corresponding to the user's fingerprint. The fingerprint sensor 2161-1 may include any one of an optical type fingerprint sensor and a capacitive type fingerprint sensor.

The input sensor 2161-2 may generate a data value corresponding to coordinate information of the user's body input or the pen input. The input sensor 2161-2 may convert a capacitance change caused by the input into the data value. The input sensor 2161-2 may detect the input by the passive pen, or may transmit/receive data to/from the active pen.

The input sensor 2161-2 may measure a bio-signal, such as blood pressure, moisture or body fat. In an embodiment, when a portion of the body of the user touches a sensor layer or a sensing panel, and does not move for a predetermined period of time, the input sensor 2161-2 may output information desired by the user to the display module 2140 by detecting the bio-signal based on a change in electric field due to the portion of the body, for example.

The digitizer 2161-3 may generate a data value corresponding to coordinate information of the input by the pen. The digitizer 2161-3 may convert an amount of an electromagnetic change caused by the input into the data value. The digitizer 2161-3 may detect the input by the passive pen, or may transmit/receive data to/from the active pen.

At least one of the fingerprint sensor 2161-1, the input sensor 2161-2 and the digitizer 2161-3 may be implemented as a sensor layer formed on the display panel 2141 through a continuous process. The fingerprint sensor 2161-1, the input sensor 2161-2 and the digitizer 2161-3 may be disposed above the display panel 2141, or at least one of the fingerprint sensor 2161-1, the input sensor 2161-2 and the digitizer 2161-3 may be disposed below the display panel 2141.

Two or more of the fingerprint sensor 2161-1, the input sensor 2161-2 and the digitizer 2161-3 may be integrated into one sensing panel through the same process. When integrated into one sensing panel, the sensing panel may be disposed between the display panel 2141 and a window disposed above the display panel 2141. In some embodiments, the sensing panel may be disposed on the window, but the location of the sensing panel is not limited thereto.

At least one of the fingerprint sensor 2161-1, the input sensor 2161-2 and the digitizer 2161-3 may be embedded in the display panel 2141. That is, at least one of the fingerprint sensor 2161-1, the input sensor 2161-2 and the digitizer 2161-3 may be simultaneously formed through a process of forming elements (e.g., light-emitting elements, transistors, etc.) included in the display panel 2141.

In addition, the sensor module 2161 may generate an electrical signal or a data value corresponding to an internal state or an external state of the electronic device 2101. The sensor module 2161 may further include, e.g., a gesture sensor, a gyro sensor, an atmospheric pressure sensor, a magnetic sensor, an acceleration sensor, a grip sensor, a proximity sensor, a color sensor, an infrared ("IR") sensor, a biometric sensor, a temperature sensor, a humidity sensor or an illuminance sensor.

The antenna module 2162 may include one or more antennas for transmitting or receiving a signal or power to or from the outside. In some embodiments, the communication module 2173 may transmit or receive a signal to or from the external electronic device 2102 through an antenna suitable for a communication method. An antenna pattern of the antenna module 2162 may be integrated into one component (e.g., the display panel 2141) of the display module 2140 or the input sensor 2161-2.

The sound output module 2163 may output sound signals to the outside of the electronic device 2101. The sound output module 2163 may include, e.g., a speaker or a receiver. The speaker may be used for general purposes, such as playing multimedia or playing record. The receiver may be used for receiving incoming calls. In some embodiments, the receiver may be implemented as separate from, or as part of the speaker. A sound output pattern of the sound output module 2163 may be integrated into the display module 2140.

The camera module 2171 may capture a still image and a moving image. In some embodiments, the camera module 2171 may include one or more lenses, an image sensor or an image signal processor. The camera module 2171 may further include an infrared camera capable of measuring the presence or absence of the user, the user's location and the user's line of sight.

The light module 2172 may provide light. The light module 2172 may include a light-emitting diode or a xenon lamp. The light module 2172 may operate in conjunction with the camera module 2171, or may operate independently of the camera module 2171.

The communication module 2173 may support establishing a wired or wireless communication channel between the electronic device 2101 and the external electronic device 2102 and performing communication via the established communication channel. The communication module 2173 may include a wireless communication module (e.g., a cellular communication module, a short-range wireless communication module or a global navigation satellite system ("GNSS") communication module) or a wired communication module (e.g., a local area network ("LAN") communication module or a power line communication ("PLC") module). The communication module 2173 may communicate with the external electronic device 2102 via a short-range communication network (e.g., Bluetooth™, wireless-fidelity ("Wi-Fi") direct, or infrared data association ("IrDA")) or a long-range communication network (e.g., a cellular network, the Internet or a computer network (e.g., LAN or wide area network ("WAN")). These various types of communication modules 2173 may be implemented as a single chip, or may be implemented as multi-chips separate from each other.

The input module 2130, the sensor module 2161, the camera module 2171, or the like may be used to control an operation of the display module 2140 in conjunction with the processor 2110.

The processor 2110 may output a command or data to the display module 2140, the sound output module 2163, the camera module 2171 or the light module 2172 based on input data received from the input module 2130. In an embodiment, the processor 2110 may generate image data corresponding to input data applied through a mouse or an active pen, and may output the image data to the display module 2140, for example. In an alternative embodiment, the processor 2110 may generate command data corresponding to the input data, and may output the command data to the camera module 2171 or the light module 2172. When no input data is received from the input module 2130 for a predetermined period of time, the processor 2110 may switch an operation mode of the electronic device 2101 to a low power mode or a sleep mode, thereby reducing power consumption of the electronic device 2101.

The processor 2110 may output a command or data to the display module 2140, the sound output module 2163, the camera module 2171 or the light module 2172 based on sensing data received from the sensor module 2161. In an embodiment, the processor 2110 may compare authentication data applied by the fingerprint sensor 2161-1 with authentication data stored in the memory 2120, and then may execute an application according to the comparison result, for example. The processor 2110 may execute a command or output corresponding image data to the display module 2140 based on the sensing data sensed by the input sensor 2161-2 or the digitizer 2161-3. In a case where the sensor module 2161 includes a temperature sensor, the processor 2110 may receive temperature data from the sensor module 2161, and may further perform luminance correction on the image data based on the temperature data.

The processor 2110 may receive measurement data about the presence or absence of the user, the location of the user and the user's line of sight from the camera module 2171. The processor 2110 may further perform luminance correction on the image data based on the measurement data. In an embodiment, after the processor 2110 determines the presence or absence of the user based on the input from the camera module 2171, the data conversion circuit 2112-2 or the gamma correction circuit 2112-3 may perform the luminance correction on the image data, and the processor 2110 may provide the luminance-corrected image data to the display module 2140, for example.

At least some of the above-described components may be coupled mutually and communicate signals (e.g., commands or data) therebetween via an inter-peripheral communication scheme (e.g., a bus, general purpose input and output ("GPIO"), serial peripheral interface ("SPI"), mobile industry processor interface ("MIPI") or ultra-path interconnect ("UPI")). The processor 2110 may communicate with the display module 2140 via an agreed interface. Further, any one of the above-described communication methods may be used between the processor 2110 and the display module 2140, but the communication method between the processor 2110 and the display module 2140 is not limited to the above-described communication method.

The electronic device 2101 according to various embodiments described above may be various types of devices. In an embodiment, the electronic device 2101 may include at least one of a portable communication device (e.g., a smart phone), a computer device, a portable multimedia device, a portable medical device, a camera, a wearable device and a home appliance, for example. However, the electronic device 2101 in embodiments is not limited to the above-described devices.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A scan driver including a plurality of stages, each of the plurality of stages comprising:
   a control circuit which controls a voltage of a first node and a voltage of a second node in response to an input signal, a first clock signal and a second clock signal;
   a carry output circuit which outputs a carry signal in response to the voltage of the first node and the voltage of the second node;
   an enable node controlling circuit which controls a voltage of an enable node in response to the carry signal, an enable signal and an inverted enable signal;
   a masking circuit which controls a voltage of a third node in response to the voltage of the second node and the voltage of the enable node; and
   a scan output circuit which outputs a scan signal in response to the voltage of the first node and the voltage of the third node.

2. The scan driver of claim 1, wherein, in a case where the enable signal has a first level before the carry signal having the first level is output, the enable node controlling circuit controls the voltage of the enable node to a second level, and
   wherein, while the carry signal having the first level is output, the masking circuit controls the voltage of the third node to the second level in response to the voltage of the enable node having the second level, and the scan output circuit outputs the scan signal having the first level in response to the voltage of the third node having the second level.

3. The scan driver of claim 2, wherein, in a case where the enable signal is changed from the first level to the second level while the carry signal having the first level is output, the enable node controlling circuit holds the voltage of the enable node as the second level until outputting the carry signal having the first level is completed.

4. The scan driver of claim 1, wherein, in a case where the enable signal has a second level before the carry signal having a first level is output, the enable node controlling circuit controls the voltage of the enable node to the first level, and wherein, while the carry signal having the first level is output, the masking circuit controls the voltage of the third node to the first level in response to the voltage of the enable node having the first level, and the scan output circuit does not output the scan signal having the first level in response to the voltage of the third node having the first level.

5. The scan driver of claim 4, wherein, in a case where the enable signal is changed from the second level to the first level while the carry signal having the first level is output, the enable node controlling circuit holds the voltage of the enable node as the first level until outputting the carry signal having the first level is completed.

6. The scan driver of claim 1, wherein, while the carry signal having a first level is output, the enable node controlling circuit holds the voltage of the enable node as a previous level.

7. The scan driver of claim 1, wherein, when the carry signal having a first level is not output, the enable signal has the first level, and the inverted enable signal has a second level, the enable node controlling circuit controls the voltage of the enable node to the second level, and wherein, when the carry signal having the first level is not output, the enable signal has the second level, and the inverted enable signal has the first level, the enable node controlling circuit controls the voltage of the enable node to the first level.

8. The scan driver of claim 1, wherein the enable node controlling circuit includes:

first and second transistors coupled in series between a high gate voltage line and the enable node, the first transistor being turned on in response to the carry signal, the second transistor being turned on in response to the enable signal; and third and fourth transistors coupled in series between the enable node and a low gate voltage line, the third transistor being turned on in response to the inverted enable signal, the fourth transistor being turned on in response to the carry signal.

9. The scan driver of claim 8, wherein the first transistor includes a gate which receives the carry signal, a first terminal coupled to the high gate voltage line, and a second terminal, wherein the second transistor includes a gate which receives the enable signal, a first terminal coupled to the second terminal of the first transistor, and a second terminal coupled to the enable node, wherein the third transistor includes a gate which receives the inverted enable signal, a first terminal coupled to the enable node, and a second terminal, and wherein the fourth transistor includes a gate which receives the carry signal, a first terminal coupled to the second terminal of the third transistor, and a second terminal coupled to the low gate voltage line.

10. The scan driver of claim 8, wherein the enable node controlling circuit further includes:

a first capacitor coupled between the enable node and the low gate voltage line.

11. The scan driver of claim 1, wherein the masking circuit separates the second node from the third node when the voltage of the enable node has a first level, and couples the second node to the third node when the voltage of the enable node has a second level.

12. The scan driver of claim 1, wherein the masking circuit includes:

a fifth transistor which selectively couples the second node to the third node in response to the voltage of the enable node.

13. The scan driver of claim 12, wherein the fifth transistor includes a gate coupled to the enable node, a first terminal coupled to the second node, and a second terminal coupled to the third node.

14. The scan driver of claim 12, wherein the masking circuit further includes:

a second capacitor coupled between a high gate voltage line and the third node; and sixth and seventh transistors coupled in series between the high gate voltage line and the third node, the sixth transistor being turned on in response to the carry signal, the seventh transistor being turned on in response to the enable signal.

15. The scan driver of claim 14, wherein the sixth transistor includes a gate which receives the carry signal, a first terminal coupled to the high gate voltage line, and a second terminal, and wherein the seventh transistor includes a gate which receives the enable signal, a first terminal coupled to the second terminal of the sixth transistor, and a second terminal coupled to the third node.

16. The scan driver of claim 1, wherein the carry output circuit includes:

an eighth transistor including a gate coupled to the second node, a first terminal coupled to a high gate voltage line, and a second terminal coupled to a carry output node; and a ninth transistor including a gate coupled to the first node, a first terminal coupled to the carry output node, and a second terminal coupled to a low gate voltage line.

17. The scan driver of claim 1, wherein the scan output circuit includes:

a tenth transistor including a gate coupled to the third node, a first terminal coupled to a high gate voltage line, and a second terminal coupled to a scan output node; and an eleventh transistor including a gate coupled to the first node, a first terminal coupled to the scan output node, and a second terminal coupled to a low gate voltage line.

18. The scan driver of claim 1, wherein transistors included in each of the plurality of stages are implemented with p-type metal-oxide-semiconductor ("PMOS") transistors.

19. The scan driver of claim 18, wherein the carry signal and the scan signal are active high signals having a high level as an active level.

20. A display device comprising:

a display panel including a plurality of pixels;

a data driver which provides a data signal to each of the plurality of pixels;

a scan driver which provides a scan signal to each of the plurality of pixels; and a controller which controls the data driver and the scan driver, wherein the scan driver includes a plurality of stages, and each of the plurality of stages comprises:

a control circuit which controls a voltage of a first node and a voltage of a second node in response to an input signal, a first clock signal and a second clock signal;

a carry output circuit which outputs a carry signal in response to the voltage of the first node and the voltage of the second node;

an enable node controlling circuit which controls a voltage of an enable node in response to the carry signal, an enable signal and an inverted enable signal;

a masking circuit which controls a voltage of a third node in response to the voltage of the second node and the voltage of the enable node; and a scan output circuit which outputs the scan signal in response to the voltage of the first node and the voltage of the third node.

\* \* \* \* \*